US012643310B2

(12) United States Patent
Matsushita et al.

(10) Patent No.: US 12,643,310 B2
(45) Date of Patent: Jun. 2, 2026

(54) OPTICAL FILM AND IMAGE DISPLAY DEVICE

(71) Applicant: DAI NIPPON PRINTING CO., LTD., Tokyo (JP)

(72) Inventors: Hiroki Matsushita, Tokyo (JP); Yoshimasa Ogawa, Tokyo (JP); Yousuke Kousaka, Tokyo (JP); Jun Sato, Tokyo (JP); Keisuke Ebisu, Tokyo (JP); Kazuya Honda, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 16/651,219

(22) PCT Filed: Sep. 28, 2018

(86) PCT No.: PCT/JP2018/036601
§ 371 (c)(1),
(2) Date: Mar. 26, 2020

(87) PCT Pub. No.: WO2019/066078
PCT Pub. Date: Apr. 4, 2019

(65) Prior Publication Data

US 2020/0247092 A1 Aug. 6, 2020

(30) Foreign Application Priority Data

Sep. 29, 2017 (JP) ................................ 2017-190707

(51) Int. Cl.

| | |
|---|---|
| ***B32B 17/10*** | (2006.01) |
| ***G02B 1/14*** | (2015.01) |
| ***H10K 59/80*** | (2023.01) |

(52) U.S. Cl.
CPC ........ *B32B 17/10798* (2013.01); *B32B 17/10* (2013.01); *G02B 1/14* (2015.01);
(Continued)

(58) Field of Classification Search
CPC .............. B32B 17/10798; B32B 17/10; B32B 2383/00; B32B 2457/206; B32B 7/02;
(Continued)

(56) References Cited

U.S. PATENT DOCUMENTS

2005/0084622 A1* 4/2005 Houghtaling .......... G02B 1/113 428/323
2006/0008662 A1* 1/2006 Arai .......................... C09J 7/22 428/447
(Continued)

FOREIGN PATENT DOCUMENTS

CN 102015287 4/2011
CN 102574736 7/2012
(Continued)

OTHER PUBLICATIONS

Machine translation of JP 2008-105191 A (Year: 2008).*
(Continued)

*Primary Examiner* — Callie E Shosho
*Assistant Examiner* — Steven A Rice
(74) *Attorney, Agent, or Firm* — HSML P.C.

(57) ABSTRACT

An aspect of the present invention provides an optical film (10) including a glass base material (11) having a thickness of 30 μm or more and 200 μm or less and a resin layer (12) adjacent to the glass base material (11), wherein the resin layer (12) has a Young's modulus of 70 MPa or more and 1200 MPa or less at 25° C.

7 Claims, 4 Drawing Sheets

(52) U.S. Cl.
CPC ..... *B32B 2383/00* (2013.01); *B32B 2457/206* (2013.01); *H10K 59/8791* (2023.02)

(58) Field of Classification Search
CPC ........... B32B 27/00; B32B 27/06; G02B 1/14; G02B 1/18; H10K 59/00; H10K 59/8791; H10K 77/111; G09F 9/00; H05B 33/02
USPC .......................................................... 428/429
See application file for complete search history.

(56) References Cited

U.S. PATENT DOCUMENTS

| | | | | |
|---|---|---|---|---|
| 2007/0243364 | A1* | 10/2007 | Maekawa | G02B 1/04 524/110 |
| 2011/0039097 | A1 | 2/2011 | Murashige et al. | |
| 2012/0156439 | A1 | 6/2012 | Mori et al. | |
| 2012/0196103 | A1 | 8/2012 | Murashige et al. | |
| 2016/0039183 | A1 | 2/2016 | Murashige et al. | |
| 2016/0194448 | A1 | 7/2016 | Song et al. | |
| 2016/0195660 | A1* | 7/2016 | Nakao | G02B 5/3033 427/164 |
| 2019/0300425 | A1* | 10/2019 | Ikadai | G06F 1/181 |
| 2020/0166677 | A1* | 5/2020 | Sugawara | B32B 7/02 |

FOREIGN PATENT DOCUMENTS

| | | | | | |
|---|---|---|---|---|---|
| CN | 102618182 | | | 8/2012 | |
| CN | 102905891 | | | 1/2013 | |
| CN | 105073412 | | | 11/2015 | |
| CN | 105082671 | | | 11/2015 | |
| JP | 2003-248429 | | | 9/2003 | |
| JP | 2005-048140 | | | 2/2005 | |
| JP | 2007-512547 | | | 5/2007 | |
| JP | 2008105191 | A | * | 5/2008 | |
| JP | 2008-165040 | | | 7/2008 | |
| JP | 2011-088789 | | | 5/2011 | |
| JP | 2012-167247 | | | 9/2012 | |
| JP | 2013-184396 | | | 9/2013 | |
| JP | 2016071086 | A | * | 5/2016 | |
| JP | 2016-125063 | | | 7/2016 | |
| JP | 2017-019674 | | | 1/2017 | |
| KR | 10-2016-0065146 | | | 6/2016 | |
| KR | 20170081011 | A | * | 7/2017 | H01L 51/5281 |
| TW | 201008768 | | | 3/2010 | |
| WO | 2005/043203 | | | 5/2005 | |
| WO | 2015050862 | | | 4/2015 | |
| WO | WO-2017154977 | A1 | * | 9/2017 | G02B 5/30 |

OTHER PUBLICATIONS

Machine translation of JP 2016-071086 A (Year: 2016).*
Machine translation of KR 10-2017-0081011 A (Year: 2017).*
Machine translation of WO 2017/154977 A1 (Year: 2017).*
International Search Report, issued in the corresponding PCT Application No. PCT/JP2018/036601, dated Nov. 6, 2018, 5 pages.
International Preliminary Report on Patentability, issued in the corresponding PCT Application No. PCT/JP2018/036601, dated Mar. 31, 2020, 11 pages.
Chinese Office Action, issued in the corresponding Chinese application No. 20188061570.8, dated Apr. 9, 2021, 11 pages (machine translation enclosed).
Japanese Office Action, issued in the corresponding Japanese patent application No. 2019-545204, dated Aug. 30, 2022, 6 pages (including machine translation).

* cited by examiner

OPTICAL FILM AND IMAGE DISPLAY DEVICE

CROSS-REFERENCE TO RELATED APPLICATION

The present application enjoys the benefit of priority to the prior Japanese Patent Application No. 2017-190707 (filed on Sep. 29, 2017), the entire disclosure of which is incorporated herein by reference.

TECHNICAL FIELD

The present invention relates to an optical film and image display device.

BACKGROUND ART

Image display devices such as smartphones and tablet terminals have been popular in recent years, and development of foldable image display devices is currently ongoing. Such devices as smartphones and tablet terminals are usually covered with glass. However, if an image display device covered with an ordinary glass is deliberately folded, the glass cover is highly likely to be cracked owing to its low flexibility in spite of its high hardness. Thus, a study is conducted on the use of an optical film for foldable image display devices, wherein the optical film includes a flexible thin film glass having a smaller thickness than an ordinary cover glass (see, for example, Patent Literature 1).

CITATION LIST

Patent Literature

Patent Literature 1: Japanese Patent Application Publication No. 2016-125063

SUMMARY OF THE INVENTION

In such a foldable image display device, the surface of the optical film may receive an impact and the optical film is thus required to have some impact resistance.

An ordinary cover glass is made of a sheet of glass having a large thickness, and is not easily cracked even if subjected to impact. In contrast, a thin film glass has a smaller thickness, and thus has low impact absorbency; and if the surface of such a thin film glass is subjected to impact, the thin film glass is cracked; or even if the thin film glass is not cracked, the layer disposed more internally than the thin film glass in the image display device causes a depression, and the surface of the thin film glass accordingly causes a depression in some cases.

Additionally, an impact applied to the surface of the thin film glass is transmitted to a member (for example, a display panel such as an organic light-emitting diode panel) present inside an image display device, thus damaging the member in some cases.

Under such a situation, there is currently a demand for an optical film which maintains flexibility, which is less prone to crack and allows the display surface of an image display device to be inhibited from causing a depression even if an impact is applied to the surface, and additionally, which has impact resistance such that a member present more internally than the thin film glass in the image display device is not damaged.

The present invention is designed to solve the above problems. That is, an object of the present invention is to provide an optical film having flexibility and impact resistance and an image display device including the optical film.

The present invention includes the following inventions.

[1] An optical film including a glass base material having a thickness of 30 μm or more and 200 μm or less and a resin layer adjacent to the glass base material, wherein the resin layer has a Young's modulus of 70 MPa or more and 1200 MPa or less at 25° C.

[2] The optical film according to [1], wherein the resin layer has a film thickness of 100 μm or more and 500 μm or less.

[3] The optical film according to [1] or [2], wherein the resin layer contains a silicone resin.

[4] An image display device including a display panel and the optical film according to any one of [1] to [3] placed on the observer's side of the display panel.

[5] The image display device according to [4], wherein the display panel is an organic light-emitting diode panel.

According to the present invention, an optical film having flexibility and impact resistance can be provided. According to the present invention, an image display device including such an optical film can be provided.

DESCRIPTION OF EMBODIMENTS

Figure 1:
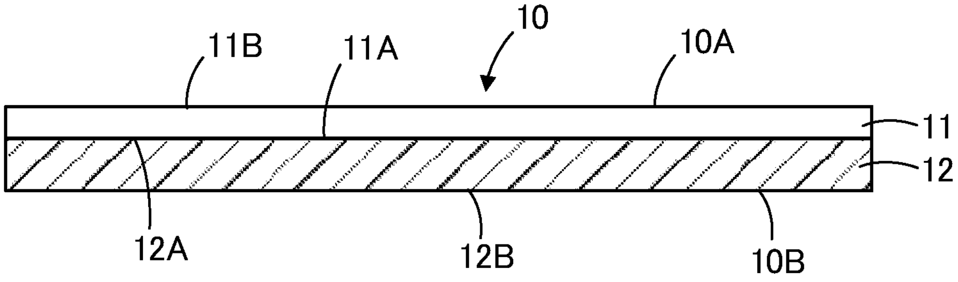
FIG. 1 depicts the schematic diagram of an optical film according to an embodiment.
Figure 3A:
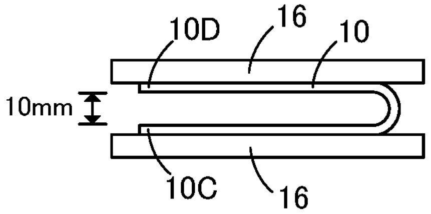
FIGS. 3 (A) and 3 (B) schematically illustrate the steps of the static folding test.
Figure 3B:
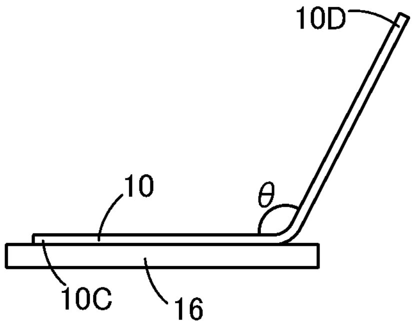
Figure 4:
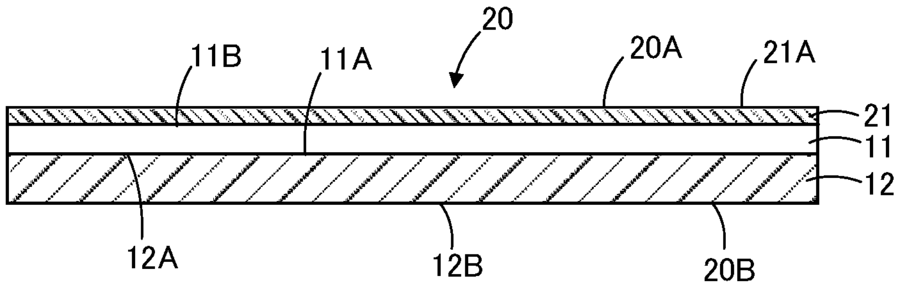
FIG. 4 depicts the schematic diagram of another optical film according to an embodiment.
Figure 5:
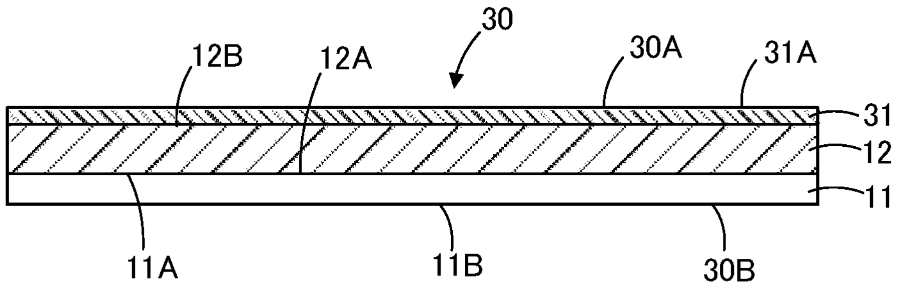
FIG. 5 depicts the schematic diagram of another optical film according to an embodiment.
Figure 6:
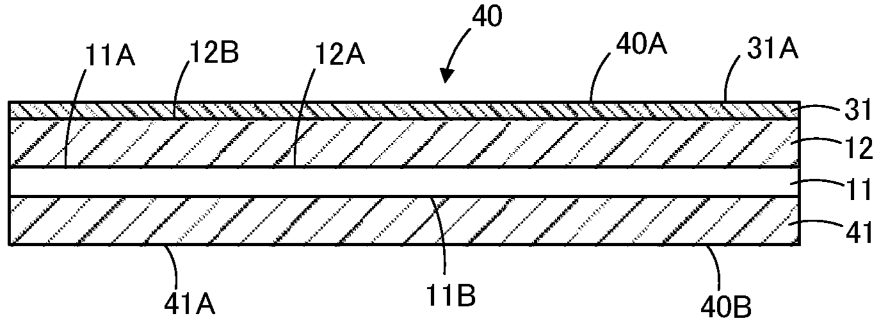
FIG. 6 depicts the schematic diagram of another optical film according to an embodiment.

An optical film and an image display device according to an embodiment of the present invention are now described below with reference to the drawings. FIG. 1 depicts the schematic diagram of an optical film according to the present embodiment, FIGS. 2 (A) to 2 (C) schematically illustrate the steps of the successive folding test, FIGS. 3 (A) and 3 (B) schematically illustrate the steps of the static folding test, and FIGS. 4 to 6 depict the schematic diagrams of other optical films according to the present embodiment.

<<<Optical Film>>>

An optical film 10 shown in FIG. 1 includes a glass base material 11 having a thickness of 30 μm or more and 200 μm or less and a resin layer 12 adjacent to the glass base material 11. In FIG. 1, the surface 10A of the optical film 10 corresponds to the second surface 11B of the glass base material 11 opposite from the first surface 11A on the resin layer 12 side. The surface 10A of the optical film 10 corresponds to the second surface 11B of the glass base material 11, and thus, the surface 11A of the optical film 10 can obtain the same surface properties as an ordinary cover glass. In this specification, the phrase, "the surface" of the optical film, is used to refer to one surface of the optical film.

Thus, the surface opposite to the surface of the optical film will be referred to as "the back surface", distinguished from the surface of the optical film. The back surface 10B of the optical film 10 corresponds to the second surface 12B of the resin layer 12 opposite from the first surface 12A on the glass base material 11 side.

The optical film 10 has flexibility. Specifically, no crack or break is formed in the optical film 10 even in cases where the below-described folding test (successive folding test) is repeated on the optical film 10 preferably one hundred thousand times, more preferably two hundred thousand times, and further preferably one million times. In cases where the successive folding test is repeated on the optical film 10 one hundred thousand times and the optical film 10 is, for example, cracked or broken, the optical film 10 shows low foldability. The successive folding test may be carried out by folding the optical film 10 with the glass base material 11 facing either inward or outward. In either case, no crack or break is preferably formed in the optical film 10.

Figure 2A:
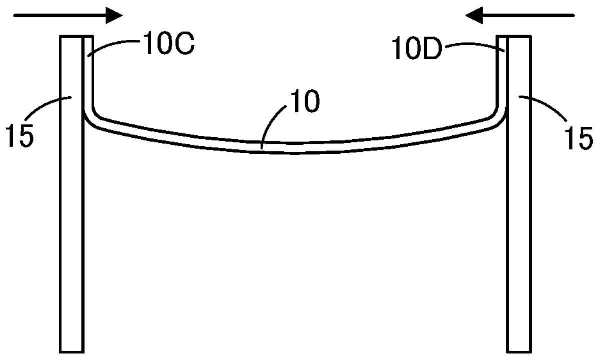
FIGS. 2 (A) to 2 (C) schematically illustrate the steps of the successive folding test.
Figure 2B:
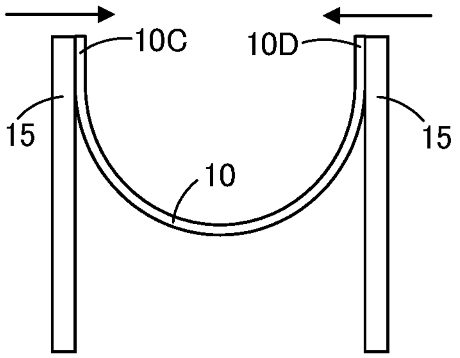

The successive folding test is carried out as follows. The successive folding test starts with fixing the edge 10C and opposite edge 10D of the optical film 10 cut to a size of 30 mm×100 mm to fixing members 15 arranged in parallel to each other, as shown in FIG. 2 (A). Additionally, the fixing members 15 can slide in the horizontal direction, as shown in FIG. 2 (A).

Next, the fixing members 15 are moved close to each other to fold and deform the optical film 10, as shown in FIG. 2 (B); the fixing members 15 are further moved until a gap of 10 mm is left between the two opposing edges 10C and 10D of the optical film 10 fixed to the fixing members 15, as shown in FIG. 2 (C); subsequently, the fixing members 15 are moved in opposite directions to resolve the deformation of the optical film 10.

As shown in FIGS. 2 (A) to (C), the fixing members 15 can be moved to fold the optical film 10 at an angle of 180 degrees. Additionally, a gap of 10 mm can be maintained between the two opposing edges 100 and 10D of the optical film 10 by carrying out the successive folding test in a manner that prevents the bent part 10E of the optical film 10 from being forced out beyond the lower edges of the fixing members 15 and controls a distance between the fixing members 15 when they approach each other closest. In this case, the outer width of the bent part 10E is considered as 10 mm. It is preferable that no crack or break is formed in the optical film 10 after folding the optical film 10 at an angle of 180 degrees in a manner that leaves a gap of 10 mm between the opposite edges of the optical film 10, unfolding the folded optical film, and repeating such a folding test one hundred thousand times. It is more preferable that no crack or break is formed in the optical film 10 after folding the optical film 10 at an angle of 180 degrees in a manner that leaves a gap of 6 mm, 5 mm, 3.5 mm, or 2 mm between the opposite edges of the optical film 10, unfolding the folded optical film, and repeating such a successive folding test one hundred thousand times (the smaller the gap between the edges, the more preferable).

In cases where an additional film, such as a polarizing plate, is provided on one surface of the optical film 10 through an adhesive or adhesion layer, the successive folding test should be carried out after removing the additional film and the adhesive or adhesion layer. The additional film can be removed, for example, as follows. First of all, a laminate consisting of an optical film attached to an additional film through an adhesive or adhesion layer is heated with a hair dryer and is slowly separated by inserting a cutter blade into a possible interface between the optical film and the additional film. By repeating such a process of heating and separation, the adhesive or adhesion layer and the additional film can be removed. Even if such a removal process is performed, the successive folding test is not significantly affected.

The optical film 10 preferably has an opening angle θ of 100° or more after being subjected to a static folding test. Specifically, the edge 10C and opposite edge 10D of the optical film 10 are first fixed to fixing members 16 arranged in parallel to each other, as shown in FIG. 3(A), in such a manner that a gap of 10 mm is left between the edge 10C and the edge 10D. Then, the optical film 10 is subjected to a static folding test, in which the folded optical film is left to stand at 70° C. for 240 hours. As shown in FIG. 3 (B), one of the fixing members 16 is then detached from the edge 10D after the static folding test, and the optical film is thereby released from the folded state and left to stand at room temperature for 30 minutes, followed by measuring the opening angle θ of the optical film 10, wherein the optical film 10 is naturally opened to form the angle. In this regard, a larger opening angle θ means better recoverability, and the maximum is 180°. The static folding test may be carried out by folding the optical film 10 with the glass base material 11 facing either inward or outward. In either case, the opening angle θ is preferably 100° or more.

In cases where an additional film, such as a polarizing plate, is provided on one surface of the optical film 10 through an adhesive or adhesion layer, the static folding test should be carried out after removing the additional film and the adhesive or adhesion layer in the same manner as described above. Even if such a removal process is performed, the static folding test is not significantly affected.

The surface 10A of the optical film 10 preferably has a hardness (pencil hardness) of 2H or more as measured by the pencil hardness test defined by JIS K5600-5-4: 1999. The pencil hardness can be measured by carrying out a pencil hardness test on the surface of the optical film, wherein a piece having a size of 50 mm×100 mm is cut out from the optical film and fixed on a glass plate with Cello-Tape®, manufactured by Nichiban Co., Ltd., so as to generate no fold or wrinkle. The pencil hardness test should be carried out as follows: using a pencil hardness testing machine (product name "Pencil Scratch Hardness Tester (electric type)"; manufactured by Toyo Seiki Seisaku-sho, Ltd.), a pencil (product name "uni"; manufactured by Mitsubishi Pencil Co., Ltd.) is moved at a speed of 1 mm/second while a load of 750 g is applied to the pencil. The grade of the hardest pencil that does not scratch the surface of the optical film during the pencil hardness test is determined as the pencil hardness of the optical film. A plural number of pencils with different hardness are used for the measurement of pencil hardness and the pencil hardness test is repeated five times on each pencil. In cases where no scratch is made on the surface of the optical film with a pencil with specific hardness in four or more out of the five replicates, the pencil with the hardness is determined to make no scratch on the surface of the optical film. The above-described scratch refers to a scratch which is visibly detectable when the surface of an optical film subjected to the pencil hardness test is observed under transmitting fluorescent light.

The optical film 10 preferably has a light transmittance of 8% or less at a wavelength of 380 nm. In cases where the above-described transmittance of the optical film 10 is 8% or less and such an optical film is used in a mobile terminal, a polarizer inside the mobile terminal can be inhibited from being exposed to ultraviolet light and thus inhibited from being degraded. The above-described transmittance can be measured using a spectrophotometer (product name "UV-3100PC"; manufactured by Shimadzu Corporation; light source: tungsten lamp and deuterium lamp). The above-described transmittance is the arithmetic mean of three measurements obtained by measuring a cut piece of the optical film with a size of 50 mm×100 mm. The maximum light transmittance of the optical film 10 is more preferably 5%. The above-described transmittance of the optical film 10 can be achieved by adjusting the amount of the below-described ultraviolet absorber added to the resin layer 12.

The optical film 10 preferably has a total light transmittance of 70% or more. The optical film 10 having a total light transmittance of 70% or more can obtain a sufficient optical performance. The above-described total light transmittance can be measured using a haze meter (product name "HM-150", manufactured by Murakami Color Research Laboratory Co., Ltd.) in accordance with JIS K7361-1: 1997. The above-described total light transmittance is defined as the arithmetic mean of three haze values, wherein the three haze values are obtained by cutting a piece of 50 mm×100 mm from one optical film and placing the optical film piece without any curl or wrinkle and without any fingerprint or dirt, into the haze meter in such a manner that the resin layer side faces opposite to the light source to measure the haze value, and repeating the measurement three times. The phrase "measured three times" as used herein should refer not to measuring at the same position three times but to measuring at three different positions. If a piece having the same size as described above cannot be cut out from the optical film, a piece having a sample size of 21 mm or more in diameter is required because, for example, the HM-150 haze meter has an entrance port aperture having a diameter of 20 mm for use in the measurement. Thus, a piece having a size of 22 mm×22 mm or larger may be cut out from the optical film as appropriate. If the optical film is small in size, the optical film is gradually shifted or turned in such an extent that the light source spot is within the piece of film to secure three measurement positions. The optical film 10 preferably has a total light transmittance of 80% or more, more preferably 90% or more.

In cases where an additional film, such as a polarizing plate, is provided on one surface of the optical film 10 through an adhesive or adhesion layer, the total light transmittance should be measured after removing the additional film and the adhesive or adhesion layer in the same manner as described above. Even if such a removal process is performed, measurement of the total light transmittance is not significantly affected.

The optical film 10 preferably has a haze value (total haze value) of 2% or less. In cases where the above-described haze value of the optical film is 2% or less and such an optical film is used in a mobile terminal, the image display screen of the mobile terminal can be inhibited from turning white in color. The above-described haze value can be measured using a haze meter (product name "HM-150"; manufactured by Murakami Color Research Laboratory Co., Ltd.) in accordance with JIS K7136: 2000. The above-described haze value is defined as the arithmetic mean of three haze values, wherein the three haze values are obtained by cutting a piece of 50 mm×100 mm from one optical film and placing the optical film piece without any curl or wrinkle and without any fingerprint or dirt, into the haze meter in such a manner that the resin layer side faces opposite to the light source to measure the haze value, and repeating the measurement three times. If a piece having the same size as described above cannot be cut out from the optical film, a piece having a sample size of 21 mm or more in diameter is required because, for example, the HM-150 haze meter has an entrance port aperture having a diameter of 20 mm for use in the measurement. Thus, a piece having a size of 22 mm×22 mm or larger may be cut out from the optical film as appropriate. If the optical film is small in size, the optical film is gradually shifted or turned in such an extent that the light source spot is within the piece of film to secure three measurement positions. The above-described haze value is more preferably 1.5% or less, still more preferably 1.0% or less. The above-described haze value of the optical film 10 can be achieved by adjusting the amount of the below-described ultraviolet absorber added to the resin layer 12.

In cases where an additional film, such as a polarizing plate, is provided on one surface of the optical film 10 through an adhesive or adhesion layer, the haze value should be measured after removing the additional film and the adhesive or adhesion layer in the same manner as described above. Even if such a removal process is performed, measurement of the haze value is not significantly affected.

Light emitting diodes are actively employed in recent years as the backlight source for image display devices such as personal computers and tablet terminals and such light emitting diodes strongly emit light called blue light. The blue light has a wavelength of 380 to 495 nm and other properties similar to those of ultraviolet light, and the energy of the blue light is so high that the blue light not absorbed by the cornea and the crystalline lens and passing into the retina is considered as a cause of retinal damage, eye strain, sleep disorder, and the like. Thus, an optical film used in an image display device is preferred to have no influence on the color representation on a display screen and to have an excellent blue light blocking property. Therefore, the optical film 10 is preferred to have a spectral transmittance of less than 1% at a wavelength of 380 nm, a spectral transmittance of less than 10% at a wavelength of 410 nm, and a spectral transmittance of 70% or more at a wavelength of 440 nm in view of blue light blocking effect because the above-described optical film having a spectral transmittance of 1% or more at a wavelength of 380 nm or a spectral transmittance of 10% or more at a wavelength of 410 nm may not solve blue light problems and the optical film having a spectral transmittance of less than 70% at a wavelength of 440 nm may give some effects on the color representation on the display screen of an image display device in which the optical film is used. In the blue light wavelength range, the optical film 10 can sufficiently absorb light having a wavelength of 410 nm or less and sufficiently pass light having a wavelength of 440 nm or more, and can exhibit excellent blue light blocking performance without affecting the color representation on a display screen. Additionally, use of the optical film 10 with such an excellent blue light blocking property in an organic light-emitting diode (OLED) display device as an image display device effectively inhibits degradation of the organic light-emitting diode device.

Preferably, the optical film 10 has a transmittance of nearly 0% for light with a wavelength of up to 380 nm, gradually increases the light transmittance above a wavelength of 410 nm, and exhibits a sharp increase of light transmittance around a wavelength 440 nm. Specifically, the spectral transmittance of the optical film preferably varies sigmoidally with the wavelength, for example, from 410 nm to 440 nm. The above-described optical film has: more preferably a spectral transmittance of less than 0.5%, further preferably less than 0.2%, at a wavelength of 380 nm; more preferably a spectral transmittance of less than 7%, more preferably less than 5%, at a wavelength of 410 nm; and more preferably a spectral transmittance of 75% or more, further preferably 80% or more, at a wavelength of 440 nm. The optical film 10 preferably has a spectral transmittance of less than 50% at a wavelength 420 nm. The optical film 10 fulfilling such requirements with respect to spectral transmittance exhibits a sharp increase of transmittance around a wavelength of 440 nm and can obtain a very excellent blue light-blocking property without affecting the color representation on a display screen.

The optical film 10 has: more preferably a spectral transmittance of less than 0.1% at a wavelength of 380 nm; more preferably a spectral transmittance of less than 7% at a wavelength of 410 nm; and more preferably a spectral transmittance of 80% or more at a wavelength of 440 nm.

The slope as a function of wavelength obtained by the least square method applied to the transmittance of the optical film 10 is preferably more than 2.0 in a spectrum range from 415 to 435 nm. In cases where the above-described slope is 2.0 or less, the optical film fails to cut a sufficient amount of light in the blue light wavelength range, such as a wavelength range from 415 to 435 nm, and may exhibit an attenuated blue light-cutting function. Also, the optical film may cut an excess amount of light in the blue light wavelength range (wavelengths from 415 to 435 nm) and, in that case, interferes with the backlight or the light in a wavelength range emitted from an image display device (for example, light with wavelengths equal to and above 430 nm emitted from an OLED) and be highly likely to cause a problem such as poor color representation. The above-described slope can be calculated, for example, by measuring at least five points spaced 1 nm apart to obtain the transmittance data in a range from 415 to 435 nm using a spectrophotometer with the ability to permit measurement to 0.5% accuracy (product name "UV-3100PC"; manufactured by Shimadzu Corporation).

The optical film 10 preferably has a blue light blocking rate of 40% or more. In cases where the blue light blocking rate is less than 40%, the above-described blue light problems may not be sufficiently resolved. The above-described blue light blocking rate is calculated according to, for example, JIS T7333: 2005. Such a blue light blocking rate can be effected, for example, by adding the below-described sesamol type benzotriazole monomer to the resin layer 12.

The optical film 10 preferably has a water vapor transmission rate (WVTR: Water Vapor Transmission Rate) of 0.01 g/($m^2$·24 h) or less at 23° C. and a relative humidity of 90%. The water vapor transmission rate can be measured using a water vapor transmission rate measurement device (product name "PERMATRAN-W3/31"; manufactured by MOCON) by the method in accordance with JIS K7129: 2008. The above-described water vapor transmission rate is the arithmetic mean of three measurements obtained by measuring a cut piece of the optical film with a size of 100 mm×100 mm. The upper limit of the water vapor transmission rate of the optical film 10 is more preferably 0.001 g/($m^2$·24 h) or less.

The optical film 10 can be cut into a desired size or may be rolled. In cases where the optical film 10 is cut into a desired size, the optical film is not limited to a particular size, and the size of the film is appropriately determined depending on the display size of an image display device. Specifically, the optical film 10 may be, for example, 2.8 inches or more and 500 inches or less in size. The term "inch" as used herein shall refer to the length of a diagonal when the optical film is rectangular, and to the length of a diameter when the optical film is circular, and to the average of major and minor axes when the optical film is elliptical. In this respect, if the optical film is rectangular, the aspect ratio of the optical film is not limited to a particular ratio when the above-described size in inch is determined, as long as no problem is found with the optical film used for the display screen of an image display device. Examples of the aspect ratio include height-to-width ratios of 1:1, 4:3, 16:10, 16:9, and 2:1. However, particularly in optical films used for vehicle displays and digital signage systems which are rich in designs, the aspect ratio is not limited to the above-described aspect ratios. Additionally, in cases where the optical film 10 is large in size, the optical film will be cut to the A5 size (148 mm×210 mm) starting at an arbitrary position and then cut to fit size requirements of each measurement item.

<<Glass Base Material>>

The glass base material 11 has a thickness of 30 μm or more and 200 μm or less. The glass base material 11 having a thickness of 30 μm or more makes it possible that the optical film 10 is inhibited from curling and obtains sufficient hardness. Additionally, the glass base material 11 having a thickness of 200 μm or less makes it possible to obtain sufficient flexibility. Such a glass base material is also preferable in terms of making the optical film 10 more lightweight. A cross-section of the glass base material 11 is photographed using a scanning electron microscope (SEM) and the thickness of the glass base material 11 is measured at 10 different locations within the image of the cross-section, and the arithmetic mean of the 10 thickness values is determined as the thickness of the glass base material 11. As the lower limit for the glass base material 11, 35 μm or more or 40 μm or more is preferable in this order (the larger the value, the more preferable), and as the upper limit for the glass base material 11, 100 μm or less, 80 μm or less, or 60 μm or less is preferable in this order (the smaller the value, the more preferable).

Examples of glasses to be formed into the glass base material 11 include, but are not particularly limited to, silicate glass and silica glass. Among these, borosilicate glass, aluminosilicate glass, and aluminoborosilicate glass are preferable, and no-alkali glass is most preferable. Examples of commercially available products for the glass base material 11 include G-Leaf® manufactured by Nippon Electric Glass Co. Ltd., ultrathin film glass manufactured by Matsunami Glass Ind., Ltd., and the like.

<<Resin Layer>>

The resin layer 12 is a layer composed of a light-transmitting resin. The resin layer 12 is a layer having impact absorbency, and also functions as a layer which inhibits the glass base material 11 from scattering pieces of glass when the glass base material is cracked. The resin layer may have a multilayer structure composed of two or more resin layers.

The resin layer 12 preferably has a Young's modulus of 70 MPa or more and 1200 MPa or less at 25° C. The resin layer 12 having a Young's modulus of 70 MPa or more at 25° C. can inhibit damage to a member disposed more internally than the optical film 10 in the image display device when an impact is applied to the surface 10A of the optical film 10. The resin layer 12 having a Young's modulus of 1200 MPa or less at 25° C. can better inhibit the optical film 10 from being cracked when the optical film 10 is bent. As the lower limit of the Young's modulus of the resin layer 12, 80 MPa or more, 90 MPa or more, or 100 MPa or more is preferable in this order (the larger the value, the more preferable), and as the upper limit, 1000 MPa or less, 960 MPa or less, 500 MPa or less, or 300 MPa or less is preferable in this order (the smaller the value, the more preferable).

The "Young's modulus of the resin layer" as used herein should be calculated using a contact projection area $A_p$ determined in measuring the indentation hardness ($H_{IT}$) of the resin layer 12. The "indentation hardness" refers to a value determined from a load-displacement curve obtained in hardness measurement by a nanoindentation method and drawn from the loading to unloading of an indenter.

Measurement of the indentation hardness ($H_{IT}$) should be performed on a measurement sample using a "TI950 Tribolndenter" manufactured by Hysitron, Inc. Specifically, a piece having a size of 1 mm×10 mm is cut out from the optical film and embedded in an embedding resin to prepare a block, and homogeneous sections having a thickness of 70 nm or more and 100 nm or less and having no openings or the like are cut out from the block according to a commonly used sectioning technique. For the preparation of sections, an "Ultramicrotome EM UC7" (Leica Microsystems GmbH) and the like can be used. Then, the block remaining after cutting out the homogeneous sections having no openings or the like is used as a measurement sample. Subsequently, in the cross-section of the measurement sample obtained after cutting out the above-described sections, a Berkovich indenter (a trigonal pyramid, TI-0039, manufactured by BRUKER Corporation) as the above-described indenter is pressed perpendicularly into the center of the cross-section of the resin coat layer, wherein the indenter is pressed up to the maximum pressing load of 500 μN over 25 seconds under the below-mentioned measurement conditions. Here, a Berkovich indenter should be pressed into a part of the resin layer in order to avoid the influence of the glass base material and avoid the influence of the side edges of the resin layer, wherein the part is 500 nm away into the central side of the resin layer from the interface between the glass base material and the resin layer and 500 nm away into the central side of the resin layer from both side edges of the resin layer. In cases where a functional layer is present on the opposite surface of the resin layer from the glass base material side, the indenter should be pressed into a part of the resin layer, wherein the part is 500 nm away into the central side of the resin layer from the interface between the functional layer and the resin layer. Subsequently, the intender is held at the position for a certain period of time to relax the residual stress, and then unloaded over 25 seconds to measure the maximum load after the relaxation, and the maximum load $P_{max}$ (μN) and the contact projection area $A_p$ ($nm^2$) are used to calculate an indentation hardness ($H_{IT}$) from the value of $P_{max}/A_p$. The contact projection area is a contact projection area, for which the tip curvature of the indenter is corrected using fused quartz (5-0098, manufactured by BRUKER) as a standard sample in accordance with the Oliver-Pharr method. The arithmetic mean of the measurements at 10 different locations is determined as the indentation hardness ($H_{IT}$). In cases where the measurement values include a value deviating ±20% or more from the arithmetic mean value, the deviating value should be excluded, followed by remeasurement. Whether the measurement values include a value deviating ±20% or more from the arithmetic mean value should be determined on the basis of whether a value (%) calculated from (A−B)/B×100 is ±20% or more, wherein A is a measurement value, and B is the arithmetic mean value. The indentation hardness ($H_{IT}$) can be adjusted by selecting the kind and the like of the below-mentioned resin included in the resin layer.

(Measurement Conditions)

loading speed: 20 μN/second;

retention time: 5 seconds;

unloading speed: 20 μN/second;

measurement temperature: 25° C.

The Young's modulus $E_s$ of the resin layer 12 is determined as below-mentioned. First, a composite Young's modulus $E_r$ of the indenter and the resin layer is determined in accordance with the following mathematical equation (1) using a contact projection area $A_p$ determined in measuring the indentation hardness. The Young's modulus is the arithmetic mean of the Young's moduli obtained at 10 different locations, wherein each of the Young's moduli is determined from an indentation hardness measured at each of the 10 locations.

[Math. 1]

$$E_r = \frac{S\sqrt{\pi}}{2\sqrt{A_p}} \qquad (1)$$

In the mathematical equation (1), $A_p$ is a contact projection area, $E_r$ is a composite Young's modulus of the indenter and the resin layer, and S is a contact rigidity.

Then, the composite Young's modulus $E_r$ determined as above-described is used to determine the Young's modulus $E_s$ of the resin layer in accordance with the following mathematical equation (2).

[Math. 2]

$$E_s = \{1-(v_s)^2\}/\left\{\frac{1}{E_r} - \frac{1-(v_i)^2}{E_i}\right\} \qquad (2)$$

In the mathematical equation (2), $E_i$ is the Young's modulus of the indenter, $E_s$ is the Young's modulus of the resin layer, $v_i$ is the Poisson's ratio of the indenter, and $v_s$ is the Poisson's ratio of the resin layer. The resin layer does not undergo a volume change by deformation, and thus, is regarded as having a Poisson's ratio of 0.5.

The resin layer 12 preferably has a film thickness of 100 μm or more and 500 μm or less. In cases where the resin layer 12 has a film thickness of 100 μm or more, the resin layer 12 does not have reduced hardness; additionally, in cases where the resin layer has a film thickness of 500 μm or less, the film thickness is not too large, and is thus suitable for thickness reduction and is not likely to reduce the processing properties. The lower limit for the resin layer 12 is more preferably 150 μm or more, while the upper limit for the resin layer 12 is more preferably 300 μm or less, still more preferably 200 μm or less.

A cross-section of the resin layer is photographed using a scanning transmission electron microscope (SEM) and the film thickness of the resin layer is measured at 10 different locations within the image of the cross-section, and the arithmetic mean of the 10 film thickness values is determined as the film thickness of the resin layer. A specific method of acquiring cross-sectional images is described below. First of all, a piece of 1 mm×10 mm cut out from an optical film is embedded in an embedding resin to prepare a block, and cross-sections having no roughness are produced from the block according to a commonly used cross-sectional cutting technique. For the preparation of cross-sections, an "Ultramicrotome EM UC7" (Leica Microsystems GmbH) and the like can be used. Subsequently, cross-sectional images of the measurement sample are acquired using a scanning transmission electron microscope (SEM) (product name "S-4800"; manufactured by Hitachi High-Technologies Corporation). The cross-sectional images are acquired using the above-described S-4800 by setting the detector to "SE," the accelerating voltage to "5 kV," and the emission current to "10 μA." The focus, contrast, and brightness are appropriately adjusted at a magnification of 200 to 10,000 times, so that each layer can be identified by observation. The magnification is preferably 200 times to 2,000 times, more preferably 400 times to 1,000 times, most preferably 600 times to 1,000 times. Furthermore, the beam monitor aperture, the objective lens aperture, and the WD may be respectively set to "3," "3," and "8 mm," in acquirement of cross-sectional images using the above-described S-4800. Additionally, higher magnification may make it more difficult to find the interfacial contrast. In that case, the observation is also carried out with low magnification. For example, the observation is carried out with two magnifications consisting of a higher magnification and a lower magnification, such as 200 and 1,000 times, or 1,000 and 2,000 times, to determine the above arithmetic means at both magnifications, which are further averaged to determine the film thickness of the resin layer.

The resin as a component of the resin layer 12 is not limited to a particular resin as long as the resin allows the Young's modulus to be within the above-described ranges. Examples of such a resin include a silicone resin and the like. Analysis of the resin layer 12 by, for example, pyrolysis GC-MS and FT-IR can determine the structure of a polymer (a repeating unit) that constitutes the resin as a component of the resin layer 12. In particular, pyrolysis GC-MS is useful because it can detect monomer units contained in the resin layer 12 as the monomer components.

<Silicone Resin>

A silicone resin is a resin having a siloxane bond in the main-chain. Using a silicone resin to form the resin layer 12 can enhance adhesiveness between the glass base material 11 and the resin layer 12. This is considered to be because hydrosilyl groups (Si—H groups) remaining in the surface of the resin layer 12 undergo hydrolysis reaction to turn into silanol groups (Si—OH groups) and because these silanol groups undergo condensation reaction with silanol groups present in the surface of the glass base material 11. Additionally, using a silicone resin to form the resin layer 12 can inhibit the resin layer 12 from shrinking when the resin layer is formed, and thus, can inhibit the optical film 10 from curling. Furthermore, a silicone resin has more excellent durability than a (meth)acrylic resin, and thus, using a silicone resin to form the resin layer 12 can enhance the durability.

The silicone resin may have an aromatic group, and may have no aromatic group. The resin layer 12 formed of a silicone resin having an aromatic group is harder and can obtain more excellent impact resistance than a resin layer formed of a silicone resin having no aromatic group. Additionally, the resin layer 12 formed of a silicone resin having no aromatic group enables the refractive index of the resin layer 12 to be closer to that of the glass base material 11 than a resin layer formed of a silicone resin having an aromatic group, and thus can inhibit interfacial reflection between the glass base material 11 and the resin layer 12. As used herein, an "aromatic group" means a carbocyclic aryl group (hereinafter, may be simply referred to as an "aryl group"), and encompasses aromatic groups in which a substitutable position of the aryl group has been substituted with a substituent. The aryl group preferably has 6 to 25 carbon atoms, more preferably 6 to 15 carbon atoms, most preferably 6 to 10 carbon atoms. Specific examples of aryl groups include phenyl groups and naphthyl groups.

The weight average molecular weight of the silicone resin is not limited to a particular value, and is preferably such a weight average molecular weight as allows the viscosity at 25° C. to be 300 centipoise or more to 10000 centipoise.

The silicone resin may be a cured product of any one of an addition reaction type of silicone resin composition, a condensation reaction type of silicone resin composition, and an ionizing radiation curable type of silicone resin composition. Among these, a cured product of an addition reaction type of silicone resin composition is preferable in terms of hardness.

Examples of addition reaction types of silicone resin compositions which can be used include such compositions containing: an organopolysiloxane having, per molecule, two or more alkenyl groups bonded to a silicon atom (in other words, an organoalkenylpolysiloxane); an organopolysiloxane having a hydrogen atom bonded to a silicon atom (a hydrosilyl group) (in other words, an organohydrogenpolysiloxane); and a platinum group catalyst. The alkenyl group of the organoalkenylpolysiloxane undergoes hydrosilylation addition reaction with a hydrosilyl group of the organohydrogenpolysiloxane to form a cured product.

The main-chain of an organoalkenylpolysiloxane generally contains repeated diorganosiloxane units, and may contain a partially branched structure or a cyclic structure.

The alkenyl group of an organoalkenylpolysiloxane is generally a vinyl group, allyl group, propenyl group, isopropenyl group, or the like, and among these, a vinyl group is preferable. Additionally, the alkenyl group is preferably bonded only to the silicon atom at an end of the molecular chain.

Examples of a functional group which is other than the above-described alkenyl groups and is to be bonded to a silicon atom include monovalent hydrocarbon groups including: alkyl groups such as a methyl group, ethyl group, and propyl group; cycloalkyl groups such as a cyclopentyl group and a cyclohexyl group; allyl groups such as a phenyl group, xylyl group, and biphenylyl group; aralkyl groups such as a benzyl group, phenylethyl group, and phenylpropyl group. Additionally, part or all of the hydrogen atoms bonded to the carbon atoms of a monovalent hydrocarbon group may be substituted with a halogen atom such as fluorine, chlorine, or bromine, or a cyano group. In this regard, all of the functional groups which is other than the alkenyl groups and is bonded to the silicon atoms are optionally not the same groups.

An organohydrogenpolysiloxane acts as a cross-linking agent for an organoalkenylpolysiloxane. One molecule of an organohydrogenpolysiloxane preferably has 2 or more and 100 or less hydrosilyl groups.

A platinum group-based catalyst (platinum group-based catalyst for hydrosilylation) is a catalyst for advancing and promoting a hydrosilylation reaction between the alkenyl group in the above-described organoalkenylpolysiloxane and the hydrosilyl group in the above-described organohydrogenpolysiloxane. Examples of platinum group-based catalysts include platinum-based catalysts, palladium-based catalysts, rhodium-based catalysts, and the like, and among these, platinum-based catalysts in particular are preferable in terms of economical efficiency and reactivity.

The resin layer 12 may contain an ultraviolet absorber, a spectral transmittance modifier, or the like if the resin layer has a Young's modulus within the above-described range at 25° C.

<Ultraviolet Absorber>

Optical films are particularly suitably used in mobile terminals such as foldable smartphones and tablet terminals, and such mobile terminals are often used outdoors and thus each have a problem that a polarizer located closer to a display element than an optical film is easily degraded by exposure to ultraviolet light. However, in cases where a resin layer placed on the surface of a polarizer facing toward a display screen contains an ultraviolet absorber, the resin layer can advantageously prevent the polarizer from being degraded by exposure to ultraviolet light. The ultraviolet absorber (UVA) may be contained in the below-mentioned hard coat layer.

Examples of the ultraviolet absorber include triazine-based ultraviolet absorbers, benzophenone-based ultraviolet absorbers, and benzotriazole-based ultraviolet absorbers.

Examples of the above-described triazine-based ultraviolet absorbers include 2-(2-hydroxy-4-[1-octyloxycarbonylethoxy]phenyl)-4,6-bis(4-phenylphenyl)-1,3,5-triazine, 2-[4-[(2-hydroxy-3-dodecyloxypropyl)oxy]-2-hydroxyphenyl]-4,6-bis(2,4-dimethylphenyl)-1,3,5-triazine, 2,4-bis[2-hydroxy-4-butoxyphenyl]-6-(2,4-dibutoxyphenyl)-1,3,5-triazine, 2-[4-[(2-hydroxy-3-tridecyloxypropyl)oxy]-2-hydroxyphenyl]-4,6-bis(2,4-dimethylphenyl)-1,3,5-triazine, and 2-[4-[(2-hydroxy-3-(2'-ethyl)hexyl)oxy]-2-hydroxyphenyl]-4,6-bis(2,4-dimethylphenyl)-1,3,5-triazine. Examples of commercially available triazine-based ultraviolet absorbers include Tinuvin 460, Tinuvin 477 (both are manufactured by BASF SE), and LA-46 (manufactured by ADEKA Corporation).

Examples of the above-described benzophenone-based ultraviolet absorbers include 2-hydroxybenzophenone, 2,4-dihydroxybenzophenone, 2,2'-dihydroxy-4,4'-dimethoxybenzophenone, 2,2',4,4'-tetrahydroxybenzophenone, 2-hydroxy-4-methoxybenzophenone, hydroxymethoxybenzophenone sulfonate and its trihydrate, and sodium hydroxymethoxybenzophenone sulfonate. Examples of commercially available benzophenone-based ultraviolet absorbers include CHMASSORB 81/FL (manufactured by BASF SE).

Examples of the above-described benzotriazole-based ultraviolet absorbers include 2-ethylhexyl-3-[3-tert-butyl-4-hydroxy-5-(5-chloro-2H-benzotriazol-2-yl)phenyl]propionate, 2-(2H-benzotriazol-2-yl)-6-(linear and branched dodecyl)-4-methylphenol, 2-[5-chloro (2H)-benzotriazol-2-yl]-4-methyl-6-(tert-butyl)phenol, 2-(2H-benzotriazol-2-yl)-4,6-di-tert-pentylphenol, 2-(2'-hydroxy-5'-methyl phenyl)benzotriazole, 2-(2'-hydroxy-3',5'-di-tert-butyl phenyl) benzotriazole, 2-(2'-hydroxy-3'-tert-butyl-5'-methylphenyl) benzotriazole, 2-(2'-hydroxy-3',5'-di-tert-butylphenyl)-5-chlorobenzotriazole, 2-(2'-hydroxy-3'-(3",4",5",6"-tetrahydrophthalimidomethyl)-5'-methylphenyl) benzotriazole, 2,2-methylenebis(4-(1,1,3,3-tetramethylbutyl)-6-(2H-benzotriazol-2-yl)phenol), and 2-(2'-hydroxy-3'-tert-butyl-5'-methylphenyl)-5-chlorobenzotriazole. Examples of commercially available benzotriazole-based ultraviolet absorbers include KEMISORB 71D, KEMISORB 79 (both are manufactured by Chemipro Kasei Kaisha, Ltd.), JF-80, JAST-500 (both are manufactured by Johoku Chemical Co., Ltd.), ULS-1933D (manufactured by Ipposha Oil Industries Co., Ltd.), and RUVA-93 (manufactured by Otsuka Chemical Co., Ltd.).

Among those ultraviolet absorbers, triazine-based and benzotriazole-based ultraviolet absorbers are suitably used. Preferably, the ultraviolet absorber is highly soluble in a resin component included in the hard coat layer, and also bleeds less out from the hard coat layer after the above-described successive folding test. The ultraviolet absorber has preferably been polymerized or oligomerized. As the ultraviolet absorber, polymers or oligomers containing the benzotriazole, triazine, or benzophenone backbone are preferred, specifically including ultraviolet absorbers obtained by thermal copolymerization of a (meth)acrylate containing the benzotriazole or benzophenone backbone and a methylmethacrylate (MMA) at an arbitrary ratio. In cases where the optical film is applied to an organic light-emitting diode (OLED) display device, the ultraviolet absorber can play a role in protection of the OLED from ultraviolet light.

The content of the ultraviolet absorber is not limited to a particular amount but is preferably 1 part by mass or more and 6 parts by mass or less relative to 100 parts by mass of solids in the resin layer composition. In cases where the content is less than 1 part by mass, the hard coat layer may be allowed to contain only an insufficient amount of the above-described ultraviolet absorber; in cases where the content is more than 6 parts by mass, a marked coloration and a reduction of strength may occur on the resin layer. The minimum content of the above-described ultraviolet absorber is more preferably 2 parts by mass or more, while the maximum content of the above-described ultraviolet absorber is more preferably 5 parts by mass or less.

<Spectral Transmittance Modifier>

The spectral transmittance modifier is an agent for modifying the spectral transmittance of an optical film. When the resin layer 12 contains, for example, the sesamol type benzotriazole monomer represented by the general formula (1) below, the above-described spectral transmittance can advantageously be achieved.

[Chem. 1]

(1)

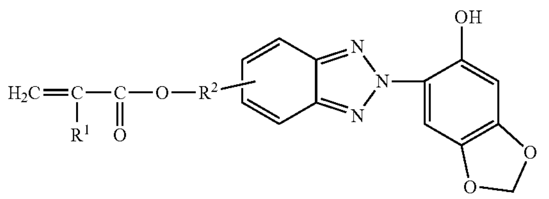

In the general formula (1), $R^1$ represents a hydrogen atom or methyl group; $R^2$ represents a linear or branched alkylene or oxyalkylene group having 1 to 6 carbon atoms.

The above-described sesamol type benzotriazole monomer is not limited to a particular sesamol-bound benzotriazole monomer. Specific examples of the substance can include 2-[2-(6-hydroxybenzo[1,3]dioxol-5-yl)-2H-benzotriazole-5-yl]ethylmethacrylate, 2-[2-(6-hydroxybenzo[1,3]dioxol-5-yl)-2H-benzotriazole-5-yl]ethylacrylate, 3-[2-(6-hydroxybenzo[1,3]dioxol-5-yl)-2H-benzotriazole-5-yl] propylmethacrylate, 3-[2-(6-hydroxybenzo[1,3]dioxol-5-yl)-2H-benzotriazole-5-yl]propylacrylate, 4-[2-(6-hydroxybenzo[1,3]dioxol-5-yl)-2H-benzotriazole-5-yl] butylmethacrylate, 4-[2-(6-hydroxybenzo[1,3]dioxol-5-yl)-2H-benzotriazole-5-yl]butylacrylate, 2-[2-(6-hydroxybenzo[1,3]dioxol-5-yl)-2H-benzotriazole-5-yloxy] ethylmethacrylate, 2-[2-(6-hydroxybenzo[1,3]dioxol-5-yl)-

2H-benzotriazole-5-yloxy]ethylacrylate, 2-[3-{2-(6-hydroxybenzo[1,3]dioxol-5-yl)-2H-benzotriazole-5-yl}propanoyloxy]ethylmethacrylate, 2-[3-{2-(6-hydroxybenzo[1,3]dioxol-5-yl)-2H-benzotriazole-5-yl}propanoyloxy]ethylacrylate, 4-[3-{2-(6-hydroxybenzo[1,3]dioxol-5-yl)-2H-benzotriazole-5-yl}propanoyloxy]butylmethacrylate, 4-[3-{2-(6-hydroxybenzo[1,3]dioxol-5-yl)-2H-benzotriazole-5-yl}propanoyloxy]butylacrylate, 2-[3-{2-(6-hydroxybenzo[1,3]dioxol-5-yl)-2H-benzotriazole-5-yl}propanoyloxy]ethylmethacrylate, 2-[3-{2-(6-hydroxybenzo[1,3]dioxol-5-yl)-2H-benzotriazole-5-yl}propanoyloxy]ethylacrylate, 2-(methacryloyloxy)ethyl 2-(6-hydroxybenzo[1,3]dioxol-5-yl)-2H-benzotriazole-5-carboxylate, 2-(acryloyloxy)ethyl 2-(6-hydroxybenzo[1,3]dioxol-5-yl)-2H-benzotriazole-5-carboxylate, 4-(methacryloyloxy)butyl 2-(6-hydroxybenzo[1,3]dioxol-5-yl)-2H-benzotriazole-5-carboxylate, and 4-(acryloyloxy)butyl 2-(6-hydroxybenzo[1,3]dioxol-5-yl)-2H-benzotriazole-5-carboxylate. Additionally, these sesamol type benzotriazole monomers may be used individually or in combination of two or more.

The above-described sesamol type benzotriazole monomer may be contained in the resin layer 12. In cases where the resin layer has a multilayer structure composed of two or more resin layers, the sesamol type benzotriazole monomer may be contained in one or more resin layers to fulfill the requirements of the above-described spectral transmittance. In an exemplary configuration of the multilayer structure, for example, one of the resin layers contains a sesamol type benzotriazole monomer as described above that enables spectral transmittance only at a wavelength of 380 nm, and another resin layer contains sesamol type benzotriazole monomers as described above that enable spectral transmittance at a wavelength of 410 nm and at a wavelength of 440 nm. Furthermore, in a multilayer structure composed of three or more resin layers, each resin layer may contain a sesamol type benzotriazole monomer as described above to fulfill the requirements of the above-described spectral transmittance.

In cases where the above-described sesamo type benzotriazole monomer is contained in the resin layer 12, the above-described sesamol type benzotriazole monomer is preferably contained in the resin layer 12, for example, at a content of 15 to 30% by mass. The presence of the sesamol type benzotriazole monomer in such a content range allows the resin layer to achieve the above-described spectral transmittance. In the resin layer 12, the above-described sesamol type benzotriazole monomer may react with a resin component that composes the resin layer 12, or may not react with a resin component that composes the resin layer 12 to be contained individually.

<<Other Optical Films>>

In the optical film 10, the surface 10A of the optical film 10 corresponds to the second surface 11B of the glass base material 11, and as shown in FIG. 4, the optical film may be the optical film 20 further including the hard coat layer 21 formed on the second surface 11B side of the glass base material 11. Forming the hard coat layer 21 on the second surface 11B of the glass base material 11 affords a desired pencil hardness, and can further inhibit the glass base material 11 from scattering pieces of glass when the glass base material is cracked. In the optical film 20, the surface 20A of the optical film 20 corresponds to the surface 21A of the hard coat layer 21, and the back surface 20B corresponds to the second surface 12B of the resin layer 12. The hard coat layer 21 is adjacent to the glass base material 11. In FIGS. 4 to 6, the elements indicated by the same reference numbers as in FIG. 1 are the same as those indicated in FIG. 1, and further description is thus omitted.

The physical properties and the like of the optical film 20 are the same as those of the optical film 10, and the description thereof is thus omitted here.

<Hard Coat Layer>

The hard coat layer 21 will refer to a layer having a Martens hardness of 375 MPa or more at the center of the cross-section of the hard coat layer 21. In this specification, the "Martens hardness" refers to a hardness measured when an indenter is pressed into a specimen to a depth of 500 nm in a nanoindentation hardness test. Measurement of the Martens hardness based on the above-described nanoindentation technique will be performed on an optical film piece cut to a size of 30 mm×30 mm using a "T1950 TriboIndenter" manufactured by Hysitron, Inc. In other words, a Berkovich indenter (a trigonal pyramid, TI-0039, manufactured by BRUKER Corporation) as the above-described indenter is pressed perpendicularly 500 nm into the cross-section of the hard coat layer under the below-mentioned measurement conditions. Here, a Berkovich indenter should be pressed into a part of the hard coat layer in order to avoid the influence of the glass base material and avoid the influence of the side edges of the hard coat layer, wherein the part is 500 nm away into the central side of the hard coat layer from the interface between the glass base material and the hard coat layer and 500 nm away into the central side of the hard coat layer from both side edges of the hard coat layer. Subsequently, the intender is held at the position for a certain period of time to relax the residual stress, and then unloaded to measure the maximum load after the relaxation, and the maximum load $P_{max}$ (μN) and the depression area A ($nm^2$) having a depth of 500 nm are used to calculate a Martens hardness from the value of $P_{max}/A$. The arithmetic mean of the measurements at 10 different locations is determined as the Martens hardness.

(Measurement Conditions)

loading speed: 10 nm/second;
retention time: 5 seconds;
unloading speed: 10 nm/second;
measurement temperature: 25° C.

The hard coat layer 21 may have a monolayer structure, and may have a multilayer structure composed of two or more layers. The hard coat layer 21 preferably has a film thickness of 1 μm or more 20 μm or less. The hard coat layer 21 having a film thickness of 1 μm or more enables the hard coat layer to have sufficient hardness, and 20 μm or less makes it possible to inhibit reduction in the processing properties. The "film thickness of the hard coat layer" as used herein will refer to the sum of the film thickness (total thickness) of hard coat layers in cases where the hard coat layer has a multilayer structure. A cross-section of the hard coat layer 21 is photographed using a scanning electron microscope (SEM) and the film thickness of the hard coat layer 21 is measured at 20 different locations within the image of the cross-section, and the arithmetic mean of the 20 film thickness values is determined as the film thickness of the hard coat layer 21. The upper limit for the hard coat layer 21 is more preferably 15 μm or less in thickness, further preferably 10 μm or less in thickness.

The hard coat layer 21 contains a resin. The hard coat layer 21 may further contain inorganic particles dispersed in the resin.

(Resin)

The resin contains a polymerized product (a cured product) of a polymerizable compound (a curable compound). The polymerizable compound refers to a molecule having at least one polymerizable functional group. Examples of the polymerizable functional group include ethylenic unsaturated groups such as (meth)acryloyl group, vinyl group, and allyl group. Both "acryloyl group" and "methacryloyl group" are meant by the word "(meth)acryloyl group."

The polymerizable compound is preferably a polyfunctional (meth)acrylate. Examples of the above-described polyfunctional (meth)acrylate include trimethylolpropane tri(meth)acrylate, tripropylene glycol di(meth)acrylate, diethylene glycol di(meth)acrylate, dipropylene glycol di(meth)acrylate, pentaerythritol tri(meth)acrylate, pentaerythritol tetra(meth)acrylate, dipentaerythritol hexa(meth)acrylate, 1,6-hexanediol di(meth)acrylate, neopentyl glycol di(meth)acrylate, trimethylolpropane tri(meth)acrylate, ditrimethylolpropane tetra(meth)acrylate, dipentaerythritol penta(meth)acrylate, tripentaerythritol octa(meth)acrylate, tetrapentaerythritol deca(meth)acrylate, isocyanuric acid tri(meth)acrylate, isocyanuric acid di(meth)acrylate, polyester tri(meth)acrylate, polyesterdi(meth)acrylate, bisphenol di(meth)acrylate, diglycerol tetra(meth)acrylate, adamantyl di(meth)acrylate, isobornyl di(meth)acrylate, dicyclopentane di(meth)acrylate, tricyclodecane di(meth) acrylate, ditrimethylolpropane tetra(meth)acrylate, and those compounds modified with PO, EO, caprolactone, or the like.

Among those polyfunctional polymerizable compounds, polymerizable compounds with three to six functional groups trifunctional, such as pentaerythritol triacrylate (PETA), dipentaerythritol hexaacrylate (DPHA), pentaerythritol tetraacrylate (PETTA), dipentaerythritol pentaacrylate (DPPA), trimethylolpropane tri(meth)acrylate, tripentaerythritol octa(meth)acrylate, and tetrapentaerythritol deca(meth)acrylate, are preferred in terms of the ability to achieve the above-described Martens hardness in a suitable manner. In this specification, (meth)acrylate means either of acrylate and methacrylate.

The polymerizable compound may further contain a monofunctional (meth)acrylate monomer for the purpose of, for example, adjusting the hardness of the resin and the viscosity of the composition, and improving the adhesiveness of the resin. Examples of the above-described monofunctional (meth)acrylate monomer include hydroxyethyl acrylate (HEA), glycidyl methacrylate, methoxypolyethylene glycol (meth)acrylate, isostearyl (meth)acrylate, 2-acryloyloxyethyl succinate, acryloyl morpholine, N-acryloyloxyethyl hexahydrophthalimide, cyclohexyl acrylate, tetrahydrofuryl acrylate, isobornyl acrylate, phenoxyethyl acrylate, and adamantyl acrylate.

The weight average molecular weight of the above-described monomer is preferably less than 1,000, more preferably 200 or more and 800 or less, in terms of improving the hardness of the resin layer. Additionally, the weight average molecular weight of the above-described polymerizable oligomer is preferably 1,000 or more and 20,000 or less, more preferably 1,000 or more and 10,000 or less, and still more preferably 2,000 or more and 7,000 or less.

(Inorganic Particles)

The inorganic particles are particles composed mainly of an inorganic substance. The inorganic particles may contain an organic component, but are preferably composed only of an inorganic substance. The inorganic particles may be surface-treated with an organic component. The inorganic particles are not limited to a particular type of inorganic particles as long as those inorganic particles can improve the hardness of the hard coat layer, and silica particles are preferred in terms of the ability to achieve excellent hardness. Among silica particles, reactive silica particles are preferred. The above-described reactive silica particle can form a cross-linked structure with the above-described polyfunctional (meth)acrylate and the presence of the reactive silica particles can sufficiently increase the hardness of the hard coat layer 21.

The above-described reactive silica particle preferably has a reactive functional group on the surface, and a polymerizable functional group, such as those described above, is suitably used as the reactive functional group.

The above-described reactive silica particles are not limited to a particular type of reactive silica particles, and conventionally known reactive silica particles, such as reactive silica particles described in JP2008-165040A, can be used. Additionally, examples of commercially available reactive silica particles as describe above include MIBK-SD, MIBK-SDMS, MIBK-SDL, and MIBK-SDZL manufactured by Nissan Chemical Industries, Ltd.; and V8802 and V8803 manufactured by JGC C&C.

Additionally, the above-described silica particles may be spherical silica particles and are preferably deformed silica particles. Spherical silica particles may be combined with deformed silica particles. In this specification, the "spherical silica particle" refers to, for example, a spherical or ellipsoidal silica particle, while "deformed silica particle" refers to a silica particle with a randomly rough surface as observed on potato tubers (with the observed cross-section having an aspect ratio of 1.2 or more and 40 or less). The surface area of the above-described deformed silica particle is larger than that of a spherical silica particle, and the presence of such deformed silica particles thus increases the contact area with, for example, the above-described polyfunctional (meth)acrylate and successfully improves the hardness of the above-described hard coat layer. A transmission electron microscope (TEM) or a scanning transmission electron microscope (STEM) can be used to observe the cross-section of the hard coat layer to determine whether or not the silica particles contained in hard coat layer are deformed silica particles.

The average particle diameter of the above-described silica particles is preferably 5 nm or more and 200 nm or less. In cases where the average particle diameter is less than 5 nm, the production of silica particles with such a particle diameter is difficult, and such silica particles may aggregate each other or have a great difficulty in modification to produce a randomly rough surface, or, furthermore, deformed silica particles with such a particle diameter are less dispersible and may aggregate each other in the above-described composition before use for coating. On the other hand, the average particle diameter of the above-described deformed silica particle is more than 200 nm, problems such as formation of major roughnesses on the hard coat layer or increase of haze may occur. In cases where the silica particles are spherical silica particles, the average particle diameter of the silica particles is determined as the arithmetic mean of the particle diameters of 20 particles as measured from the cross-sectional image of the particles obtained using a transmission electron microscope (TEM) or a scanning transmission electron microscope (STEM). Additionally, in cases where the silica particles are deformed silica particles, the average particle diameter of the silica particles is determined as the arithmetic mean of the particle diameters of 20 particles, wherein each of the particle diameters is obtained by taking the average between the maximum (major axis) and minimum (minor axis) values of the distance between two points on the circumference of each deformed silica particle, wherein the values are measured from the cross-sectional image of the hard coat layer obtained using a transmission electron microscope (TEM) or a scanning transmission electron microscope (STEM).

The hardness (Martens hardness) of the hard coat layer 21 can be controlled by adjusting the size and content of the above-described inorganic particles. For example, the above-described silica particles having a diameter of 5 nm or more and 200 nm or less are preferably contained in an amount of 25 to 60 parts by mass relative to 100 parts by mass of the above-described polymerizable compound in the formation of the hard coat layer.

The hard coat layer 21 may further contain an ultraviolet absorber, a spectral transmittance modifier, and/or an antifouling agent. The ultraviolet absorber and the spectral transmittance modifier are the same as the ultraviolet absorber and the spectral transmittance modifier described in the section on the resin layer 12, and the description is thus omitted here.

(Antifouling Agent)

The antifouling agent may be evenly distributed in the hard coat layer, and is preferably unevenly distributed toward the surface of the hard coat layer to attain a sufficient antifouling effect with a small added amount of the antifouling agent and to prevent the hard coat layer from reducing the strength. In cases where the hard coat layer has a monolayer structure, examples of a method of unevenly distributing the antifouling agent toward the surface of the hard coat layer include a method in which a coating film is formed using the hard coat layer composition, dried, and then heated before curing in the formation of a hard coat layer to reduce the viscosity of a resin component contained in the coating film, and thereby to increase the flowability of the antifouling agent, and consequently to distribute the antifouling agent unevenly toward the surface of the hard coat layer; and a method in which an antifouling agent with a low surface tension is chosen for use and a coating film is dried without heating to raise the antifouling agent to the surface of the coating film and the coating film is then cured to distribute the above-described antifouling agent unevenly toward the uppermost surface of the resulting hard coat layer.

The antifouling agent is not limited to a particular antifouling agent, but including, for example, silicone-based antifouling agents, fluorine-based antifouling agents, and silicone- and fluorine-based antifouling agents; those antifouling agents may be used individually or in combination. Additionally, the antifouling agent may be an acryl-based antifouling agent.

The content of the antifouling agent is preferably from 0.01 to 3.0 parts by mass relative to 100 parts by mass of the above-described resin component. In cases where the content is less than 0.01 parts by mass, the resin layer may not be allowed to attain a sufficient antifouling effect; additionally, in cases where the content is more than 3.0 parts by mass, the hard coat layer is likely to have reduced hardness.

The antifouling agent is a compound having preferably a weight average molecular weight of 5000 or less and containing preferably one or more, more preferably two or more, reactive functional groups to improve the durability of antifouling effect. Among those antifouling agents, an antifouling agent containing two or more reactive functional groups can be used to provide excellent scratch resistance.

In cases where the antifouling agent has no reactive functional group and the resulting optical film sheet is rolled or piled up, the antifouling agent moves toward the back surface of the optical film, which may cause separation of a layer of the optical film from another layer of the optical film and, furthermore, may cause separation of the layers after several rounds of the successive folding test when one of the layers is laminated or applied to the back surface of the other.

Furthermore, the above-described antifouling agent containing a reactive functional group exhibits a durable antifouling effect (durability), and a hard coat layer containing the above-described fluorine-based antifouling agent, among others, is fingerprint resistant (rendering fingerprints invisible) and also makes it easy to wipe off fingerprints. Furthermore, the above-described silicone-based antifouling agent can reduce the surface tension generated during coating of a hard coat layer composition, which increases the leveling performance and assists in preparing a hard coat layer with a desirable appearance.

A hard coat layer containing a silicone-based antifouling agent has high smoothness and strong resistance against scratching with steel wool. An optical film having a hard coat layer that contains such a silicone-based antifouling agent provides smooth touch to a touch sensor covered with the optical film, and then offers a better tactile feeling when the touch sensor is touched with a finger or pen. Additionally, the hard coat layer has fingerprint resistant (rendering fingerprints invisible) and also makes it easy to wipe off fingerprints. Furthermore, the above-described silicone-based antifouling agent can reduce the surface tension generated during coating of a hard coat layer composition, which increases the leveling performance and assists in preparing a hard coat layer with a desirable appearance.

In the optical film 20, the hard coat layer 21 is provided on the second surface 11B side of the glass base material 11, and as shown in FIG. 5, the optical film may be the optical film 30 in which the hard coat layer 31 is provided on the second surface 12B side of the resin layer 12. In the optical film 30, the surface 30A of the optical film 30 corresponds to the surface 31A of the hard coat layer 31, and the back surface 30B corresponds to the second surface 11B of the glass base material 11. The hard coat layer 31 is adjacent to the resin layer 12.

The physical properties and the like of the optical film 30 are the same as those of the optical film 10, and the description thereof is thus omitted here. The hard coat layer 31 is the same as the hard coat layer 21, and the description thereof is thus omitted here.

In the optical film 30, the back surface 30A corresponds to the second surface 11B of the glass base material 11, and as shown in FIG. 6, the optical film may be the optical film 40 further including the resin layer 41 on the second surface 11B side of the glass base material 11. The surface 40A of the optical film 40 corresponds to the surface 31A of the hard coat layer 31, and the back surface 40B corresponds to the surface 41A of the resin layer 41. The resin layer 41 is adjacent to the glass base material 11.

The properties and the like of the optical film 40 are the same as those of the optical film 10, and the description thereof is thus omitted here. The resin layer 41 is the same as the resin layer 12, and the description is thus omitted here.

In cases where the optical film 30 or 40 is incorporated in an image display device, the hard coat layer 31 is located on the observer's side of the glass base material 11. Accordingly, the glass base material 11 is located more internally than the hard coat layer 31 and the resin layer 12 in the image display device. Thus, the glass base material 11 is not easily cracked even if an impact is applied to the surface 30A or 40A of the optical film 30 or 40.

<<Optical Film Production Method>>

The optical film 10 can be produced, for example, as follows. First, a resin layer composition is applied on the first surface 11A of the glass base material 11 by a coating apparatus such as a bar coater to form a coating film of the resin layer composition.

<Resin Layer Composition>

The resin layer composition has a composition which varies depending on the resin included in the resin layer 12. In cases where the resin layer is composed of a silicone resin, the resin layer composition which can be used is an addition reaction type of silicone resin composition containing: an organoalkenylpolysiloxane having, per molecule, 2 or more alkenyl groups bonded to a silicon atom; an organohydrogenpolysiloxane; and a platinum group-based catalyst.

After the coating film of the resin layer composition is formed, the coating film is heated and cured at a temperature of, for example, 80° C. or higher and 300° C. or lower, preferably 100° C. or higher and 250° C. or lower, by various known techniques to obtain a resin layer 12. Consequently, the optical film 10 shown in FIG. 1 is obtained.

The optical film 20 can be obtained by forming the hard coat layer 21 on the second surface 11B of the glass base material 11 of the optical film 10. Specifically, a hard coat layer composition is applied to the second surface 11B of the glass base material 11 to form a coating film of the hard coat layer composition.

<Hard Coat Layer Composition>

The hard coat layer composition contains a polymerizable compound for forming the hard coat layer 21. The hard coat layer composition may additionally contain an ultraviolet absorber, a spectral transmittance modifier, an antifouling agent, inorganic particles, a leveling agent, a solvent, and a polymerization initiator, as necessary.

(Solvent)

Examples of the above-described solvent include alcohols (for example, methanol, ethanol, propanol, isopropanol, n-butanol, s-butanol, t-butanol, benzyl alcohol, PGME, ethylene glycol, diacetone alcohol), ketones (for example, acetone, methyl ethyl ketone, methyl isobutyl ketone, cyclopentanone, cyclohexanone, heptanone, diisobutyl ketone, diethyl ketone, diacetone alcohol), esters (methyl acetate, ethyl acetate, butyl acetate, n-propyl acetate, isopropyl acetate, methyl formate, PGMEA), aliphatic hydrocarbons (for example, hexane, cyclohexane), halogenated hydrocarbons (for example, methylene chloride, chloroform, carbon tetrachloride), aromatic hydrocarbons (for example, benzene, toluene, xylene), amides (for example, dimethylformamide, dimethylacetamide, n-methylpyrrolidone), ethers (for example, diethyl ether, dioxane, tetrahydrofurane), ether alcohols (for example, 1-methoxy-2-propanol), and carbonates (dimethyl carbonate, diethyl carbonate, ethylmethyl carbonate). These solvents may be used individually or in combination of two or more. Among those solvents, methyl isobutyl ketone and methyl ethyl ketone are preferred as the above-described solvent in terms of the ability to dissolve or disperse components such as urethane (meth)acrylate and other additives and thereby to apply the above-described hard coat layer composition in a suitable manner.

(Polymerization Initiator)

The polymerization initiator is a component which degrades, when exposed to ionizing radiation, and generates radicals to initiate or promote polymerization (cross-linking) of a polymerizable compound.

The polymerization initiator is not limited to a particular polymerization initiator as long as it can generate a substance that initiates a radical polymerization by exposure to ionizing radiation. Any known polymerization initiator can be used without any particular limitation, and specific examples include acetophenones, benzophenones, Michler's benzoyl benzoate, α-amyloxime esters, thioxantones, propyophenones, benzyls, benzoins, and acylphosphine oxides. Additionally, a photosensitizer is preferably mixed for use, and specific examples of the photosensitizer include n-butylamine, triethylamine, and poly-n-butylphosphine.

After the coating film of the hard coat layer composition is formed, the coating film is heated and dried at a temperature of, for example, 30° C. or higher and 120° C. or lower for a period of 10 seconds to 120 seconds by various known techniques to evaporate the solvent.

The coating film is dried and then cured by exposure to ionizing radiation such as ultraviolet light to obtain a hard coat layer 21. Consequently, the optical film 20 shown in FIG. 4 is obtained, wherein the optical film 20 includes the hard coat layer 21 on the second surface 11B of the glass base material 11.

The optical film 30 can be obtained by forming the hard coat layer 31 on the second surface 12B of the resin layer 12 of the optical film 10. The method of forming the hard coat layer 31 is the same as the method of forming the hard coat layer 21 except that a hard coat layer composition is applied to the second surface 12B of the resin layer 12, and the description thereof is thus omitted here.

The optical film 40 can be obtained by forming the resin layer 41 on the second surface 11B of the glass base material 11 of the optical film 30. The method of forming the resin layer 41 is the same as the method of forming the resin layer 12 except that a resin layer composition is applied to the second surface 11B of the glass base material 11, and the description thereof is thus omitted here.

<<<Image Display Device>>>

Figure 7:
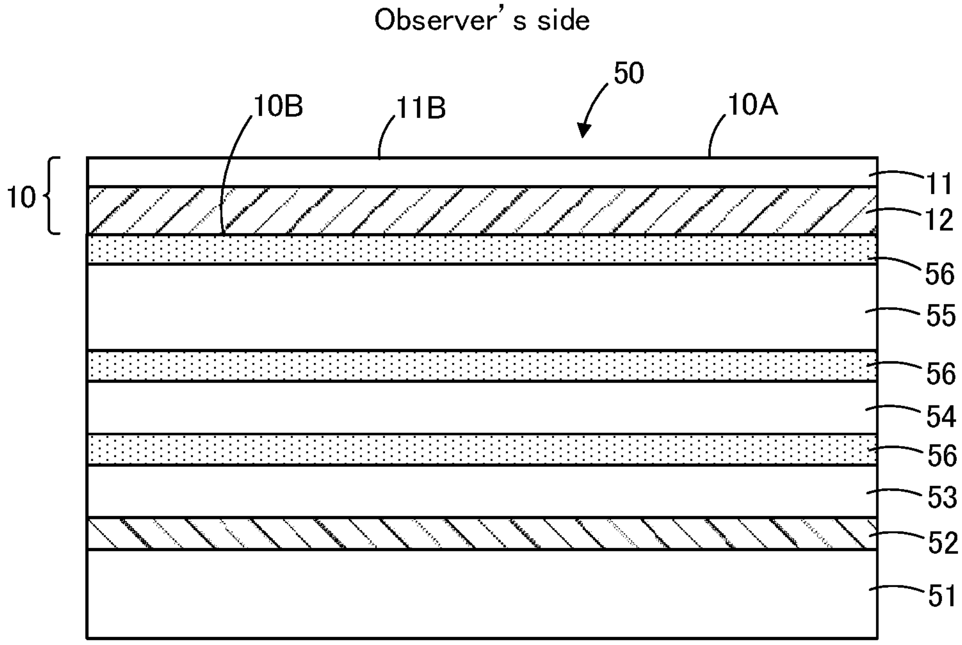
FIG. 7 depicts the schematic diagram of an image display device according to an embodiment.

The optical film 10, 20, 30, or 40 may be incorporated into a foldable image display device and then used. FIG. 7 depicts the schematic diagram of an image display device according to the present embodiment. As shown in FIG. 7, a housing 51 for housing a battery and the like, a protective film 52, a display panel 53, a circularly polarizing plate 54, a touch sensor 55, and the optical film 10 are mainly laminated in this order toward the observer in the image display device 50. A light-transmitting adhesive layer 56 is placed along the interfaces between the display panel 53 and the circularly polarizing plate 54, between the circularly polarizing plate 54 and the touch sensor 55, and between the touch sensor 55 and the optical film 10, and these components are fixed to each other with the light-transmitting adhesive layer 56. Here, the adhesive layer 56 is placed along the interfaces between the display panel 53 and the circularly polarizing plate 54, between the circularly polarizing plate 54 and the touch sensor 55, and between the touch sensor 55 and the optical film 10, and the position at which the adhesive layer is disposed is not particularly limited to anywhere as long as the position is between the optical film and the display panel. In this regard, an adhesion layer can be used in place of the adhesive layer.

In the optical film 10, the glass base material 11 is located on the observer's side of the resin layer 12. For the image display device 50, the second surface 11B of the glass base material 11 of the optical film 10 is configured to be the surface 50A of the image display device 50.

In the image display device 50, the display panel 53 is an organic light-emitting diode panel containing an organic light-emitting diode and the like. The touch sensor 54 is located closer to the display panel 53 than the circularly polarizing plate 55 but may be placed between the circularly polarizing plate 55 and the optical film 10. Additionally, the touch sensor 54 may be an on-cell type or an in-cell type.

As the adhesive layer 56, for example, an OCA (optical clear adhesive) can be used, and an adhesive layer composed of the above-described acryl-based gel is preferably used in terms of increasing the impact resistance to prevent the damage of the display panel 53. In cases where an adhesive layer composed of the above-described acryl-based gel is used as the adhesive layer 56, the above-described adhesive layer may be placed along at least any one of the interfaces between the display panel 53 and the circularly polarizing plate 54, between the circularly polarizing plate 54 and the touch sensor 55, and between the touch sensor 55 and the optical film 10.

It should be noted that the above description shows an example in which the optical film 10 is incorporated in the image display device 50, and the optical film 20, 30, or 40 can be incorporated in the same image display device as the image display device 50. In this case, the optical films 20, 30, and 40 are disposed in such a manner that the surfaces 20A, 30A, and 40A are located on the observer's side of the back surface 20B, 30B, and 40B respectively.

In the present embodiment, the glass base material 11 has a thickness of 30 μm or more and 200 μm or less, and thus, is thinner than a conventional cover glass, making it possible to impart flexibility to the optical films 10, 20, 30, and 40. Additionally, the resin layer 12 has a Young's modulus of 70 MPa or more and 1200 MPa or less at 25° C. Thus, even if an impact is applied to the surfaces 10A, 20A, 30A, and 40A of the optical films 10, 20, 30, and 40 respectively, the resin layer allows the optical films 10, 20, 30, and 40 to be less prone to crack, allows the surfaces 10A, 20A, 30A, and 40A to be inhibited from causing a depression, and additionally, can provide the optical films 10, 20, 30, and 40 with impact resistance such that a member present more internally than the glass base material 11 in the image display device is not damaged. This makes it possible to provide the optical films 10, 20, 30, and 40 which maintain flexibility and at the same time, have impact resistance.

An organic light-emitting diode is degraded by water, and thus, is usually sealed. The present embodiment is based on the use of the glass base material 11 having flexibility, and thus, has a lower water vapor transmission rate than based on the use of a resin base material having flexibility, such as polyimide. This makes it possible that the use of an organic light-emitting diode panel as the display panel 53 further inhibits the organic light-emitting diode from being degraded.

In this embodiment, the optical film 10 is used for the image display device, but the application of an optical film according to the present invention is not limited to any particular one. For example, an optical film according to the present invention may be used in various applications which require transmission of light. Additionally, an optical film according to the present invention may be used for electrical appliances, windows for houses and cars (all kinds of cars including not only automobiles but also train cars, carriage building machines, and the like) and exhibition displays besides products related to image display devices (including smartphones, tablet terminals, personal computers, wearable terminals, televisions, digital signages, public information displays (PID), on-vehicle displays, and the like). An optical film according to the present invention can suitably be used particularly for portions for which transparency is deemed to be important. Additionally, an optical film according to the present invention can suitably be used for applications which not only are seen from a technical viewpoint such as transparency but also require higher devisal quality and design quality. The form of each above-described image display device is also favorable for applications which require flexible forms, such as foldable or rollable forms.

EXAMPLES

Now, the present invention will be described in more detail by way of Examples. However, the present invention is not limited to those Examples. The phrase "a converted value based on 100% solids" below means a value determined based on the assumption that the content of solids diluted in a solvent is 100%.

<Preparation of Resin Layer Compositions>

The following components were combined to meet the composition requirements indicated below and thereby obtain resin layer compositions.

(Resin Layer Composition 1)

- Phenyl silicone (product name "OE-6652A"; manufactured by Toray Dow Corning Co., Ltd.): 20 parts by mass
- Phenyl silicone (product name "OE-6652B"; manufactured by Toray Dow Corning Co., Ltd.): 80 parts by mass (Resin Layer Composition 2)

- Phenyl silicone (product name "OE-6630A"; manufactured by Toray Dow Corning Co., Ltd.): 20 parts by mass
- Phenyl silicone (product name "OE-6630B"; manufactured by Toray Dow Corning Co., Ltd.): 80 parts by mass (Resin Layer Composition 3)

- Phenyl silicone (product name "OE-6672A"; manufactured by Toray Dow Corning Co., Ltd.): 2.5 parts by mass
- Phenyl silicone (product name "OE-6672B"; manufactured by Toray Dow Corning Co., Ltd.): 100 parts by mass (Resin Layer Composition 4)

- Phenyl silicone (product name "OE-6631A"; manufactured by Toray Dow Corning Co., Ltd.): 33.3 parts by mass
- Phenyl silicone (product name "OE-663113", manufactured by Toray Dow Corning Co., Ltd.): 66.7 parts by mass (Resin Layer Composition 5)

- Phenyl silicone (product name "OE-6636A"; manufactured by Toray Dow Corning Co., Ltd.): 33.3 parts by mass
- Phenyl silicone (product name "OE-6636B"; manufactured by Toray Dow Corning Co., Ltd.): 66.7 parts by mass (Resin Layer Composition 6)

- Methyl silicone (product name "OE-7810A"; manufactured by Toray Dow Corning Co., Ltd.): 50 parts by mass
- Methyl silicone (product name "OE-7810B"; manufactured by Toray Dow Corning Co., Ltd.): 50 parts by mass <Preparation of Hard Coat Layer Compositions>

The following components were combined to meet the composition requirements indicated below and thereby obtain a hard coat layer composition 1.

(Hard Coat Layer Composition 1)

- A mixture of dipentaerythritol pentaacrylate and dipentaerythritol hexaacrylate (product name "M403"; manufactured by Toagosei Co., Ltd.): 25 parts by mass EO-modified dipentaerythritol hexaacrylate (product name “A-DPH-6E”; manufactured by Shin-Nakamura Chemical Co., Ltd.): 25 parts by mass
Deformed silica particles (with an average particle diameter of 25 nm; manufactured by JGC C&C): 50 parts by mass (a converted value based on 100% solids)
Photopolymerization initiator (1-hydroxycyclohexyl phenyl ketone; product name “Irgacure® 184”, manufactured by BASF Japan Ltd.): 4 parts by mass
Fluorine-based leveling agent (product name “F568”; manufactured by DIC Corporation): 0.2 parts by mass (a converted value based on 100% solids)
Methyl isobutyl ketone (MIBK): 150 parts by mass

Example 1

First, a glass base material having a thickness of 50 μm (product name “Scribe Glass”; manufactured by Matsunami Glass Ind., Ltd.) was prepared, and the resin layer composition 1 was applied to a first surface of the glass base material with a bar coater to form a coating film. Then, the formed coating film was heated at 150° C. for 60 minutes and thus cured to obtain a first resin layer having a film thickness of 100 μm. Consequently, an optical film having the first resin layer formed on the first surface of the glass base material was obtained. The surface of the optical film corresponded to the surface of the glass base material, and the back surface of the optical film corresponded to the surface of the resin layer. In this regard, the thickness of the glass base material and the thickness of the first resin layer were each defined as the arithmetic mean of film thickness values measured at 10 different locations, wherein a cross-section of the glass base material and a cross-section of the first resin layer were photographed using a scanning transmission electron microscope (SEM) (product name “S-4800”; manufactured by Hitachi High-Technologies Corporation) and the film thickness of the glass base material and the film thickness of the first resin layer were measured at the respective 10 locations within the images of the cross-sections. The cross-section of the first resin layer was photographed in the below-mentioned manner. First of all, a piece of 1 mm×10 mm cut out from an optical film was embedded in an embedding resin to prepare a block, and cross-sections having no roughness were produced from the block according to a commonly used cross-sectional cutting technique. For the preparation of this cross-section, an “Ultramicrotome EM UC7” (Leica Microsystems GmbH) or the like was used. Subsequently, cross-sectional images of the measurement sample were acquired using a scanning transmission electron microscope (SEM). The cross-sectional images were acquired by setting the detector to “SE,” the accelerating voltage to “5 kV,” and the emission current to “10 μA” in the SEM observation. The focus, contrast, and brightness were appropriately adjusted at a magnification of 1000 to 10,000 times, so that each layer could be identified by observation. Furthermore, the beam monitor aperture, the objective lens aperture, and the WD were respectively set to “3,” “3,” and “8 mm,” in acquirement of cross-sectional images. Also in each of Examples 2 to 8 and Comparative Examples 1 to 6, the thickness of the glass base material and the film thickness of the resin layer were measured in the same manner as in Example 1. In this regard, the film thickness of each of the below-mentioned hard coat layer and second resin layer was also measured in the same manner as the film thickness of the first resin layer.

Example 2

In Example 2, an optical film was obtained in the same manner as in Example 1, except that the film thickness of the first resin layer was 200 μm.

Example 3

In Example 3, an optical film was obtained in the same manner as in Example 1, except that the film thickness of the first resin layer was 500 μm.

Example 4

In Example 4, an optical film was obtained in the same manner as in Example 1, except that the resin layer composition 2 was used instead of the resin layer composition 1.

Example 5

In Example 5, an optical film was obtained in the same manner as in Example 1, except that the resin layer composition 3 was used instead of the resin layer composition 1.

Example 6

In Example 6, an optical film was obtained in the same manner as in Example 1, except that a hard coat layer was further formed on the opposite surface of the glass base material of the optical film according to Example 1 from the first resin layer side. The hard coat layer was formed in the following manner. First, the hard coat layer composition 1 was applied to the other surface of the glass base material of the optical film according to Example 1 to form a coating film. The formed coating film was then heated at 70° C. for one minute to evaporate the solvent in the coating film, and was then exposed to ultraviolet light to a cumulative light dose of 200 $mJ/cm^2$ under an oxygen concentration of 200 ppm or lower with an ultraviolet irradiation device (with an H bulb as a light source; manufactured by Fusion UV Systems Inc.) to obtain a cured coating film. Thus, an optical film including the first resin layer, the glass base material, and the hard coat layer having a film thickness of 5 μm in this order was obtained. The surface of the optical film according to Example 6 corresponded to the surface of the hard coat layer, and the back surface of the optical film corresponded to the surface of the first resin layer.

Example 7

In Example 7, an optical film was obtained in the same manner as in Example 1, except that a hard coat layer having a film thickness of 5 μm was further formed on the opposite surface of the resin layer of the optical film according to Example 1 from the glass base material side. The hard coat layer was formed in the same manner as in Example 6, except that the hard coat layer composition 1 was applied to the opposite surface of the first resin layer of the optical film according to Example 1 from the glass base material side. The surface of the optical film according to Example 7 corresponded to the surface of the hard coat layer, and the back surface of the optical film corresponded to the surface of the glass base material.

Example 8

In Example 8, an optical film was obtained in the same manner as in Example 7, except that a second resin layer having a film thickness of 100 μm was further formed on the opposite surface of the glass base material of the optical film according to Example 7 from the first resin layer side. The second resin layer was formed in the same manner as the first resin layer, except that the resin layer composition 1 was applied to the opposite surface of the glass base material of the optical film according to Example 7 from the first resin layer side. The surface of the optical film according to Example 8 corresponded to the surface of the hard coat layer, and the back surface of the optical film corresponded to the surface of the second resin layer.

Comparative Example 1

In Comparative Example 1, an optical film was obtained in the same manner as in Example 1, except that a glass base material having a thickness of 300 μm (product name "D263Teco"; manufactured by Matsunami Glass Ind., Ltd.) was used instead of the glass base material having a thickness of 50 μm.

Comparative Example 2

In Comparative Example 2, an optical film was obtained in the same manner as in Example 1, except that a glass base material having a thickness of 700 μm (product name "Soda Glass"; manufactured by Hiraoka Special Glass Mfg. Co., Ltd.) was used instead of the glass base material having a thickness of 50 μm.

Comparative Example 3

In Comparative Example 3, an optical film was obtained in the same manner as in Example 1, except that the resin layer composition 4 was used instead of the resin layer composition 1.

Comparative Example 4

In Comparative Example 4, an optical film was obtained in the same manner as in Example 1, except that the resin layer composition 5 was used instead of the resin layer composition 1.

Comparative Example 5

In Comparative Example 5, an optical film was obtained in the same manner as in Example 1, except that the resin layer composition 6 was used instead of the resin layer composition 1.

Comparative Example 6

In Comparative Example 6, an optical film was obtained in the same manner as in Example 1, except that a polyimide base material having a thickness of 50 μm (product name "Neopulim"; manufactured by Mitsubishi Gas Chemical Company, Inc.) was used instead of the glass base material.

<Calculation of Young's Modulus>

The Young's modulus at 25° C. of the first resin layer of the optical film according to each of Examples and Comparative Examples was determined. First, the indentation hardness of the first resin layer was measured. Measurement of the indentation hardness ($H_{IT}$) was performed on a measurement sample using a "TI950 TriboIndenter" manufactured by Hysitron, Inc. Specifically, a piece having a size of 1 mm×10 mm was cut out from the optical film and embedded in an embedding resin to prepare a block, and homogeneous sections having a thickness of 70 nm or more and 100 nm or less and having no openings or the like were cut out from the block according to a commonly used sectioning technique. For the preparation of sections, an "Ultramicrotome EM UC7" (Leica Microsystems GmbH) was used. Then, the block remaining after cutting out the homogeneous sections having no openings or the like was used as a measurement sample. Subsequently, in the cross-section of the measurement sample obtained after cutting out the above-described sections, a Berkovich indenter (a trigonal pyramid, TI-0039, manufactured by BRUKER Corporation) as the above-described indenter was pressed perpendicularly into the first resin coat layer at the center of the cross-section, wherein the indenter is pressed up to the maximum pressing load of 500 μN over 25 seconds under the below-mentioned measurement conditions. Here, a Berkovich indenter was pressed into a part of the first resin layer in order to avoid the influence of the glass base material and avoid the influence of the side edges of the first resin layer, wherein the part is 500 nm away into the central side of the first resin layer from the interface between the glass base material and the resin layer and 500 nm away into the central side of the first resin layer from both side edges of the first resin layer. In cases where a hard coat layer is present on the opposite surface of the first resin layer from the glass base material side, the indenter was pressed into a part of the first resin layer, wherein the part is 500 nm away into the central side of the first resin layer from the interface between the hard coat layer and the first resin layer. Subsequently, the intender was held at the position for a certain period of time to relax the residual stress, and then unloaded over 25 seconds to measure the maximum load after the relaxation, and the maximum load $P_{max}$ (μN) and the contact projection area $A_p$ ($nm^2$) were used to calculate an indentation hardness ($H_{IT}$) from the value of $P_{max}/A_p$. The contact projection area was a contact projection area for which the tip curvature of the indenter was corrected using fused quartz (5-0098, manufactured by BRUKER) as a standard sample in accordance with the Oliver-Pharr method. In cases where the measurement values included a value deviating ±20% or more from the arithmetic mean value, the deviating value was excluded, followed by remeasurement.

(Measurement Conditions)

loading speed: 20 μN/second;
retention time: 5 seconds;
unloading speed: 20 μN/second;
measurement temperature: 25° C.

The Young's modulus at 25° C. was determined in accordance with the above-described mathematical equation (1) and mathematical equation (2) using the above-described contact projection area $A_p$ determined in measuring the indentation hardness ($H_{IT}$) of the obtained first resin layer. The Young's modulus was the arithmetic mean of the Young's moduli obtained at 10 different locations, wherein each of the Young's moduli was determined from an indentation hardness measured at each of the 10 locations.

<Impact Resistance Test>

The optical films according to Examples and Comparative Examples were subjected to an impact resistance test. First, a piece having a size of 100 mm×100 mm cut out from each optical film was directly placed on the surface of a Soda Glass piece having a thickness of 0.7 mm in such a manner that the back surface of the optical film was located on the Soda Glass piece side, and an impact resistance test was carried out three times, each of which an iron ball having a weight of 100 g and a diameter of 30 mm was dropped onto the surface of the optical film from 30 cm above. Here, the position onto which the iron ball was dropped in an impact resistance test was changed each time. After each impact resistance test, the optical film was visually evaluated for any depression in the surface of the optical film, and the Soda Glass was evaluated for any crack. The evaluation results were based on the following evaluation criteria.

(Crack/Depression Evaluation of Optical Film)

○: neither any crack in the optical film nor any depression in the surface of the optical film was identified in both cases where the optical film was observed in perpendicular and diagonal directions.

Δ: neither any crack in the optical film nor any depression in the surface of the optical film was identified when the optical film was observed in the perpendicular direction; but a depression(s) was/were identified in the surface of the optical film when the optical film was observed in a diagonal direction.

x: a crack(s) in the optical film or a clear depression(s) in the surface of the optical film was/were identified in both cases where the optical film was observed in perpendicular and diagonal directions.

(Evaluation of Crack in Soda Glass)

⊙: neither any crack nor any scratch was formed in Soda Glass any of the three times.

○: no crack was formed in Soda Glass any of the three times, but a scratch(es) was/were formed in any of the three times.

Δ: a crack(s) was/were formed in Soda Glass one or two of the three times.

x: a crack(s) was/were formed in Soda Glass all of the three times.

<Successive Folding Test>

Figure 2C:
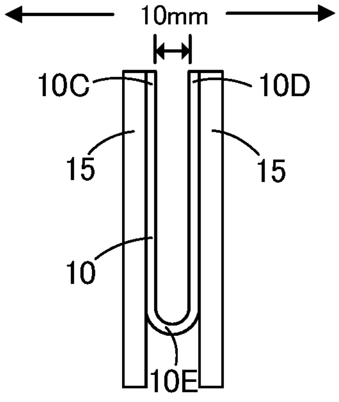

The optical film according to each of Examples and Comparative Examples was evaluated for foldability by carrying out a folding test on the optical film. Specifically, a piece having a size of 30 mm×100 mm was first cut out from the optical film and mounted to an endurance testing machine (product name "DLDMLH-FS"; manufactured by Yuasa System Co., Ltd.) by fixing the short edges (30 mm) of the optical film piece to fixing members, as shown in FIG. 2(C), in such a manner that the minimum distance between the two opposing edges was adjusted to 10 mm, and the piece was tested by repeating the successive folding test (in which the piece was folded with the surface of the optical film facing inward and with the back surface of the optical film facing outward) one hundred thousand times, in each of which the surface of the optical film piece was folded at an angle of 180 degrees, to examine whether any crack or break was formed at the bent part. Additionally, new optical films according to Examples and Comparative Examples were produced in the same manner as described above, and each of the optical films was mounted in the same manner as described above to the above-described endurance testing machine, and the back surface of the optical film was folded at an angle of 180 degrees and then unfolded (a successive folding test performed on the optical film with the back surface of the optical film facing inward and with the surface of the optical film facing outward), and the process was repeated one hundred thousand times to examine whether any crack or break was formed at the bent part. The results of the successive folding tests were evaluated based on the following evaluation criteria.

○: no crack or break was formed at the bent part in both of the successive folding tests.

x: the formation of a crack(s) or a break(s) was observed at the bent part in either of the successive folding tests.

<Static Folding Test>

The optical film according to each of Examples and Comparative Examples was subjected to a static folding test, and an opening angle formed by the optical film was measured when the optical film was released from the folded state. Specifically, a piece having a size of 30 mm×100 mm was first cut out from the optical film, and the short edges (30 mm) of the piece were fixed to the fixing members placed in parallel to each other in such a manner that a gap of 10 mm was left between the opposite edges. A static folding test was then carried out, in which the folded optical film was left to stand at 70° C. for 240 hours. One of the fixing members was then detached from the corresponding edge after the static folding test, and the optical film was released from the folded state and left to stand at room temperature for 30 minutes, followed by measuring the opening angle (see FIG. 3 (B)), wherein the optical film was naturally opened to form the angle. It should be noted that such a static folding test was carried out in both cases where the optical film was folded with the surface facing inward and where the optical film was folded with the surface facing outward. The smaller angle formed was adopted as the opening angle. In this regard, "x" in the static folding test results in Table 1 means that a crack(s) occurred when the optical film was bent in such a manner that a gap of 10 mm was left between the opposite edges.

<Measurement of Total Light Transmittance>

The optical films according to Examples and Comparative Examples were measured for total light transmittance using a haze meter (product name "HM-150"; manufactured by Murakami Color Research Laboratory Co., Ltd.) in accordance with JIS K7361-1: 1997. To measure the total light transmittance, a piece having a size of 50 mm×100 mm was cut out from the optical film and placed in the haze meter without any curl or wrinkle and without any fingerprint or dirt, and the back surface of the optical film (the back surface of the optical film) was exposed to light. Each total light transmittance value was the arithmetic mean of three measurements which were obtained by measuring each optical film three times.

<Measurement of Haze Value>

The optical films according to Examples and Comparative Examples were measured for haze value using a haze meter (product name "HM-150"; manufactured by Murakami Color Research Laboratory Co., Ltd.) in accordance with JIS K7136: 2000. To measure the haze value, a piece having a size of 50 mm×100 mm was cut out from the optical film and placed in the haze meter without any curl or wrinkle and without any fingerprint or dirt, and the back surface of the optical film was exposed to light. Each haze value was the arithmetic mean of three measurements obtained by measuring each optical film three times.

<Pencil Hardness>

The pencil hardness of the surface of each of the optical films according to Examples and Comparative Examples was measured in accordance with JIS K5600-5-4: 1999. The pencil hardness test was carried out as follows: using a pencil hardness testing machine (product name "Pencil Scratch Hardness Tester (electric type)"; manufactured by Toyo Seiki Seisaku-sho, Ltd.), an optical film piece having a cut size of 50 mm×100 mm was fixed on a glass plate having a thickness of 2 mm with Cello-Tape®, manufactured by Nichiban Co., Ltd., so as to generate no fold or wrinkle, and a pencil (product name "uni"; manufactured by Mitsubishi Pencil Co., Ltd.) was moved at a speed of 1 mm/second on the optical film piece while a load of 750 g was applied to the pencil. The grade of the hardest pencil that left no scratch on the surface of the optical film (the surface of the optical film) during the pencil hardness test was determined as the pencil hardness of the optical film. A plural number of pencils with different hardness were used for the measurement of pencil hardness and the pencil hardness test was repeated five times on each pencil. In cases where no scratch was visibly detected on the surface of the optical film in four or more out of the five replicates when the surface of the optical film was observed under transmitting fluorescent light, the pencil with the hardness was determined to make no scratch on the surface of the optical film.

<Measurement of Water Vapor Transmission Rate>

The water vapor transmission rate of the optical film according to each of Examples and Comparative Examples was measured. The water vapor transmission rate was measured under conditions of 23° C. and a relative humidity of 90% using a water vapor transmission rate measurement device (product name "PERMATRAN-W3/31"; manufactured by MOCON) in accordance with JIS K7129: 2008. To measure the water vapor transmission rate, an optical film piece having a cut size of 100 mm×100 mm was used, and the water vapor transmission rate was determined as the arithmetic mean of three measurements obtained by measuring the optical film piece three times.

<Scratch Resistance Test>

The surface of each of the optical films according to Examples and Comparative Examples was subjected to a scratch resistance test. Specifically, a piece having a size of 50 mm×100 mm was first cut out from the optical film, and the back surface of the piece was attached to an acrylic plate (product name "COMOGLAS DFA502K", manufactured by Kuraray Co., Ltd.) having a size of 10 cm×10 cm and a thickness of 2 mm via a transparent adhesive layer having a film thickness of 50 μm (having a refractive index of 1.55; product name "PDC-SI"; manufactured by Panac Co., Ltd.). Then, a scratch resistance test was carried out, in which the surface of the optical film piece was rubbed using steel wool with a grade of #0000 (product name "Bonstar"; manufactured by Nihon Steel Wool Co., Ltd.) by reciprocating the steel wool with a load of 500 g/cm$^2$ for 10 times. A check was made by visual observation on whether any scratch was found on the surface of the optical film piece. The evaluation results were based on the following evaluation criteria.

○: no scratch was found, or a few scratches were found but at a level which was not problematic for practical usage.

x: a scratch(es) was/were clearly found.

The results are shown in Tables 1 and 2 below.

TABLE 1

| | Thickness of Glass Base Material (μm) | Young's Modulus of First Resin Layer (MPa) | Impact Resistance: Crack/Depression in Optical Film | Impact Resistance: Crack in Soda Glass | Foldability | Opening Angle (°) |
|---|---|---|---|---|---|---|
| Example 1 | 50 | 180 | ○ | ○ | ○ | 180 |
| Example 2 | 50 | 190 | ○ | ○ | ○ | 165 |
| Example 3 | 50 | 196 | ○ | ○ | ○ | 135 |
| Example 4 | 50 | 81 | ○ | ○ | ○ | 180 |
| Example 5 | 50 | 953 | ○ | ○ | ○ | 180 |
| Example 6 | 50 | 195 | ○ | ○ | ○ | 180 |
| Example 7 | 50 | 193 | ○ | ○ | ○ | 180 |
| Example 8 | 50 | 192 | ○ | ○ | ○ | 180 |
| Comparative Example 1 | 300 | 186 | ○ | ○ | x | x |
| Comparative Example 2 | 700 | 189 | ○ | ○ | x | x |
| Comparative Example 3 | 50 | 51 | x | ○ | ○ | 180 |
| Comparative Example 4 | 50 | 3 | x | ○ | ○ | 180 |
| Comparative Example 5 | 50 | 42 | x | ○ | ○ | 180 |
| Comparative Example 6 | — | 190 | Δ | x | ○ | 185 |

TABLE 2

| | Total Light Transmittance (%) | Haze Value (%) | Pencil Hardness | Water Vapor Transmission Rate (g/(m$^2$ · 24 h)) | Abrasion Resistance |
|---|---|---|---|---|---|
| Example 1 | 91.7 | 0.5 | 9H | $<1 \times 10^{-3}$ | ○ |
| Example 2 | 91.5 | 0.6 | 9H | $<1 \times 10^{-3}$ | ○ |
| Example 3 | 91.4 | 0.7 | 9H | $<1 \times 10^{-3}$ | ○ |
| Example 4 | 91.7 | 0.5 | 9H | $<1 \times 10^{-3}$ | ○ |
| Example 5 | 91.7 | 0.5 | 9H | $<1 \times 10^{-3}$ | ○ |
| Example 6 | 91 | 0.5 | 6H | $<1 \times 10^{-3}$ | ○ |
| Example 7 | 91.2 | 0.5 | 3H | $<1 \times 10^{-3}$ | ○ |
| Example 8 | 91.4 | 0.5 | 3B | $<1 \times 10^{-3}$ | x |
| Comparative Example 1 | 91.6 | 0.5 | 9H | $<1 \times 10^{-3}$ | ○ |
| Comparative Example 2 | 91.7 | 0.6 | 9H | $<1 \times 10^{-3}$ | ○ |
| Comparative Example 3 | 91.7 | 0.5 | 9H | $<1 \times 10^{-3}$ | ○ |
| Comparative Example 4 | 91.7 | 0.5 | 9H | $<1 \times 10^{-3}$ | ○ |
| Comparative Example 5 | 91.7 | 0.5 | 9H | $<1 \times 10^{-3}$ | ○ |
| Comparative Example 6 | 90.5 | 0.6 | 9H | 150 | ○ |

The results will be described below. The optical films according to Comparative Examples 1 and 2 had a glass base material having a thickness out of the range of from 30 μm to 200 μm, and thus, caused a crack(s) or a break(s) in the successive folding test. Additionally, the optical films according to Comparative Examples 3 to 6 had the first resin layer having a Young's modulus at 25° C. out of the range of from 70 MPa to 1200 MPa, and thus, in the impact resistance test, the optical films were cracked, the surfaces of the optical films caused a depression, or the Soda Glass was cracked. In contrast, the optical films according to Examples 1 to 8 had a glass base material having a thickness within the range of from 30 μm to 200 μm, and thus, caused no crack or break in the successive folding test. Additionally, the optical films according to Examples 1 to 6 had the first resin layer having a Young's modulus at 25° C. within the range of from 70 MPa to 1200 MPa, and thus, in the impact resistance test, the optical films were not cracked, the surfaces of the optical films did not cause a depression, and the Soda Glass was not cracked.

Measurement of the Martens hardness of the hard coat layer of each of the optical films according to Examples 6 to 8 indicated that the hard coat layer had a Martens hardness of 830 MPa. The Martens hardness of each measurement sample was measured using a "TI950 Tribolndenter" manufactured by Hysitron, Inc. Specifically, a piece having a size of 1 mm×10 mm was cut out from the optical film and embedded in an embedding resin to prepare a block, and homogeneous sections having a thickness of 70 nm or more and 100 nm or less and having no openings or the like were cut out from the block according to a commonly used sectioning technique. For the preparation of sections, an "Ultramicrotome EM UC7" (Leica Microsystems GmbH) was used. Then, the block remaining after cutting out the homogeneous sections having no openings or the like was used as a measurement sample. Subsequently, a Berkovich indenter (a trigonal pyramid, TI-0039, manufactured by BRUKER Corporation) as an indenter was pressed, under the below-mentioned measurement conditions, 500 nm perpendicularly into the cross-section of the hard coat layer in such a cross-section of the measurement sample as obtained after cutting out the sections. Here, the Berkovich indenter was pressed into a part of the hard coat layer in order to avoid the influence of the glass base material and avoid the influence of the side edges of the hard coat layer, wherein the part was 500 nm away into the central side of the hard coat layer from the interface between the hard coat layer and the layer adjacent to the hard coat layer and 500 nm away into the central side of the hard coat layer from both side edges of the hard coat layer. Subsequently, the intender was held at the position for a certain period of time to relax the residual stress, and then unloaded to measure the maximum load after the relaxation, and the maximum load $P_{max}$ (μN) and the depression area A ($nm^2$) having a depth of 500 nm were used to calculate a Martens hardness from the value of $P_{max}/A$. The arithmetic mean of the measurements at 10 different locations was determined as the Martens hardness.

(Measurement Conditions)

loading speed: 10 nm/second;

retention time: 5 seconds;

unloading speed: 10 nm/second;

measurement temperature: 25° C.

LIST OF REFERENCE NUMERALS

10, 20, 30, 40—Optical film
10A, 20A, 30A, 40A—Surface
10B, 20B, 30B, 40B—Back surface
11—Glass base material
11A—First surface
11B—Second surface
12, 41—Resin layer
12A—First surface
12B—Second surface
21, 31—Hard coat layer
50—Image display device
53—Display panel

The invention claimed is:

1. A foldable image display device comprising:
a display panel;
an optical film on an observer's side of the display panel; and
a polarizer between the display panel and the optical film,
wherein the optical film comprises
a glass base material having a thickness of 30 μm or more and 200 μm or less,
a resin layer adjacent to the glass base material, and
a hard coat layer, wherein
the resin layer has a Young's modulus of 70 MPa or more and 1200 MPa or less at 25° C. and a thickness of 100 μm or more and 500 μm or less,
the optical film has a total light transmittance of 90% or more, the optical film has a haze of 1% or less,
the glass base material, the resin layer, and the hard coat layer are laminated in the order of
the resin layer, the glass base material, and the hard coat layer or
the glass base material, the resin layer, and the hard coat layer, from a display panel side to an observer's side,
an observer's side surface of the optical film is a surface of the image display device,
the resin layer contains a silicone resin having an aromatic group, and
the resin layer contains 1 part by mass or more and 6 parts by mass or less of an ultraviolet absorber relative to 100 parts by mass of solids in the resin layer.

2. The foldable image display device according to claim 1, wherein the display panel is an organic light-emitting diode panel.

3. The foldable image display device according to claim 1, wherein the observer's side surface of the optical film is a surface of the hard coat layer, and a back surface of the optical film is a surface of the resin layer.

4. The foldable image display device according to claim 1, wherein the aromatic group is a phenyl group.

5. The foldable image display device according to claim 1, wherein the glass base material has a thickness of 30 μm or more and 100 μm or less.

6. The foldable image display device according to claim 1, wherein the optical film exhibits no crack or break when subjected to 100,000 repetitions of a folding test that includes (a) fixing first and second opposed edges of a piece of the optical film cut to a size of 30 mm×100 mm to first and second fixing members arranged in parallel to each other, (b) moving the first and second fixing members toward each other while maintaining the parallel orientation to deform and fold the piece of the optical film 10 until a gap of 10 mm is present between the first and second opposed edges, and (c) moving the first and second fixing members away from each other to relieve the deformation of the optical film.

7. The foldable image display device according to claim 1, wherein the optical film exhibits an opening angle θ of 100° or more after being subjected to a static folding test that includes (a) arranging in parallel first and second fixing members to which respective ones of first and second edges of a piece of the optical film are fixed so that the piece of the optical film is folded with a gap of 10 mm present between the first and second edges, (b) holding the folded piece of the optical film at 70° C. for 240 hours, (c) detaching one of the fixing members from the respective edge of the piece of the optical film to release the piece of the optical film from the folded state, and (d) measuring the opening angle θ of the optical film after the piece of the optical film has been held at room temperature for 30 minutes.

* * * * *